(12) United States Patent
Ikeda et al.

(10) Patent No.: US 7,073,147 B2
(45) Date of Patent: Jul. 4, 2006

(54) METHOD OF MANUFACTURING A SEMICONDUCTOR DEVICE

(75) Inventors: Hiroyuki Ikeda, Higashimurayama (JP); Toshio Sasaki, Mizuho (JP); Akinobu Watanabe, Fuchu (JP); Toshio Yamada, Koganei (JP); Akihisa Uchida, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 366 days.

(21) Appl. No.: 10/694,825

(22) Filed: Oct. 29, 2003

(65) Prior Publication Data

US 2004/0157378 A1    Aug. 12, 2004

(30) Foreign Application Priority Data

Oct. 30, 2002    (JP)    ............................. 2002-315959

(51) Int. Cl.
    *G06F 17/50*    (2006.01)
(52) U.S. Cl. .................................. 716/9; 716/8; 716/1
(58) Field of Classification Search .................... 716/9, 716/8, 1
    See application file for complete search history.

(56) References Cited

U.S. PATENT DOCUMENTS

| | | | |
|---|---|---|---|
| 6,194,915 B1 | 2/2001 | Nakayama et al. | 326/121 |
| 6,337,593 B1 | 1/2002 | Mizuno et al. | 327/534 |
| 6,340,825 B1 | 1/2002 | Shibata et al. | 257/207 |
| 6,462,978 B1 | 10/2002 | Shibata et al. | 365/63 |

FOREIGN PATENT DOCUMENTS

WO    97/21247    6/1997

*Primary Examiner*—Sun James Lin
(74) *Attorney, Agent, or Firm*—Antonelli, Terry, Stout and Kraus, LLP.

(57) ABSTRACT

Wirings connected to a gate electrode of a slave switch circuit cell for substrate bias circuits are respectively electrically connected to a wiring for a power supply potential and a wiring for a reference potential. Thus, the switch operation of the slave switch circuit cell is made invalid. Wirings connected to n wells of respective circuit cells are electrically connected to a wiring for the power supply potential, and wirings connected to p wells of the respective circuit cells are electrically connected to the wiring. Thus, the n wells are fixed to the power supply potential, and the p wells are fixed to the reference potential.

16 Claims, 21 Drawing Sheets

FIG. 17

|  | pMIS | |
|---|---|---|
|  | HIGH Vth | LOW Vth |
| nMIS / HIGH Vth | NO NEED FOR POWER SUPPLY Vbb | NEED FOR POWER SUPPLY Vbb TO pMIS<br><br>FIX Vbb POWER SUPPLY TO nMIS (Vbn, Vbcn) TO Vdd, Vss |
| nMIS / LOW Vth | NEED FOR POWER SUPPLY Vbb TO nMIS<br><br>FIX Vbb POWER SUPPLY TO pMIS (Vbp, Vbcp) TO Vdd, Vss | NEED FOR POWER SUPPLY Vbb TO pMIS & nMIS |

METHOD OF MANUFACTURING A SEMICONDUCTOR DEVICE

TECHNICAL FIELD

The present invention relates to a method of manufacturing a semiconductor device and to semiconductor device technology in general, and, more particularly, the invention is directed to a technology that is applicable to a method of designing a semiconductor device.

BACKGROUND OF THE INVENTION

A technology for designing a semiconductor device, which has been discussed by the present inventors, is related to a semiconductor device having at least one substrate bias circuit configured according to design data. There may be cases in which, while a circuit cell kept at a low threshold voltage exists in circuit cells of a semiconductor device to improve the operating speed, for example, a problem relating to leakage current arises due to such a reduction in threshold voltage, thereby leading to an increase in power consumption and a thermal runaway during testing.

A substrate bias circuit is a circuit in which, when it is desired to suppress the leakage current in the circuit cell, a predetermined voltage is applied to a well in which the circuit cell is placed, thereby to increase the threshold voltage of the circuit cell, so as to suppress the leakage current; whereas, when the circuit cell is operated at high speed, the supply of voltage to the well is stopped, and the threshold voltage is lowered again, thereby realizing high-speed operation. A specific example of a substrate bias circuit of a semiconductor device having a CMOS circuit will be considered. In this example, there is a first well, in which one transistor constituting the CMOS circuit is disposed, and a first power supply on the high potential side are connected to each other via a first switch transistor; whereas, a second well, in which the other transistor constituting the CMOS circuit is disposed, and a second power supply on the reference potential side are connected to each other via a second switch transistor. Upon testing the semiconductor device having such a configuration, the first and second switch transistors are turned off and a potential suitable for testing is supplied from the outside to thereby suppress thermal runaway caused by the leakage current. On the other hand, during the normal operation of the semiconductor device, the first and second transistors are turned off and the first and second wells are respectively connected to the first and second power supplies to thereby prevent variations in operating speed and a latch-up or the like. For example, see Japanese Unexamined Patent Application No. Hei 9(1997)-521146 (Application number of the priority: Japanese Unexamined Patent Application No. Hei 7(1995)-315459, and International publication Number: PCT/WO97/21247, pp. 15–20, FIGS. 1 to 5).

SUMMARY OF THE INVENTION

However, the present inventors have found the following problems regarding the design technology that is typically used for such a semiconductor device.

That is, when another semiconductor device, that does not need to use substrate bias circuits partially or wholly, is designed, while adopting a semiconductor device that has substrate bias circuits in accordance with design data, there is a need to re-design the wiring layout in an extensive area of the semiconductor chip or each circuit cell that does not need to use the substrate bias circuits in order to fix the substrate biases. Therefore, the time required to design the semiconductor device becomes long. In addition, since a drastic circuit modification is performed, each circuit of the semiconductor device must be re-evaluated after its design, and the time taken to evaluate it becomes long. As a result, the TAT (Turn Around Time) of the semiconductor device becomes long.

An object of the present invention is to provide a technology that is capable of fixing substrate biases without taking a long time.

The above, other objects and novel features of the present invention will become apparent from the description provided in the present Specification and from the accompanying drawings.

A summary of a representative aspect of the invention disclosed in the present application will be explained in brief as follows:

The present invention is provided wherein, when another semiconductor device, that does not need to use substrate bias circuits partially or wholly, is designed while adopting the design of a semiconductor device that has substrate bias circuits, some of the wirings are changed in such a manner that a switch, which is used for switching to determine whether substrate biases should be applied to circuit areas that need not use the substrate bias circuits, is made invalid, and power supply voltages are applied to circuit areas that need not use the substrate bias circuits.

BRIEF DESCRIPTION OF THE DRAWINGS

FIG. 17 is a diagram illustrating indexes used upon determining whether a substrate bias power supply is made valid or invalid;

DETAILED DESCRIPTION OF THE PREFERRED EMBODIMENTS

Figure 1:
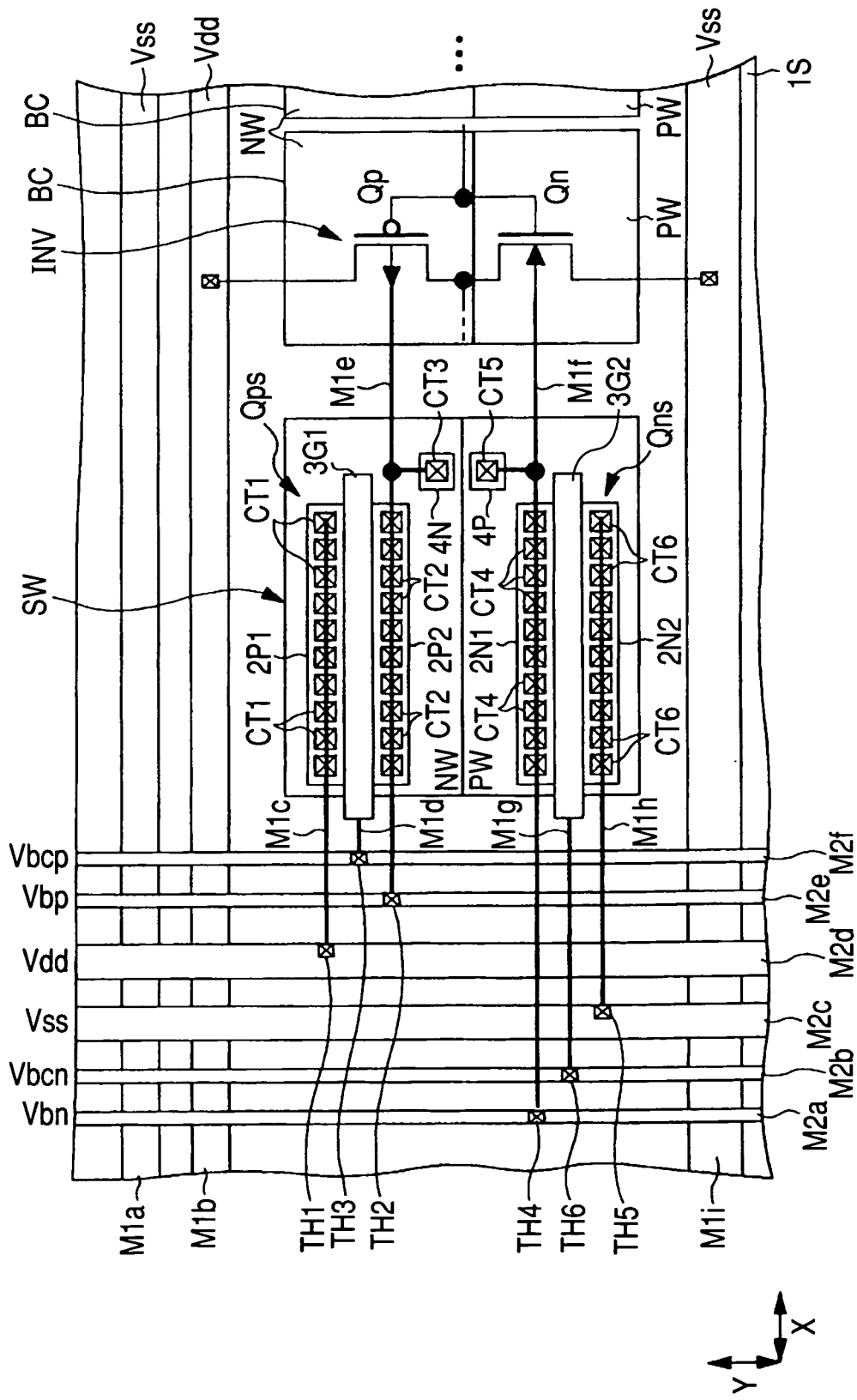
FIG. 1 is a typical fragmentary plan view showing a semiconductor device discussed by the present inventors.

Whenever circumstances require, or for the sake of convenience, the following embodiments may be described by dividing the subject matter into a plurality of sections or embodiments. However, unless otherwise specified in particular, the divisions are not irrelevant to one another. One division thereof has to do with modifications, details and supplementary explanations of some or all of the other.

When reference is made to a number of elements or the like (including the number of pieces, numerical values, quantity, range, etc.) in connection with the following embodiments, the number thereof is not limited to a specific number and may be greater than or less than or equal to the specific number, unless otherwise specified in particular and definitely limited to the specific number in principle. It is also needless to say that components (including an element or process steps, etc.) employed in the following embodiments are not always essential unless otherwise specified in particular and considered to be definitely essential in principle.

Similarly, when reference is made to the shapes, positional relations and the like of components or the like in the following embodiments, they will include ones substantially analogous or similar to their shapes or the like unless otherwise specified in particular and considered not to be definitely so in principle, etc. This is similarly applied even to the above-described numerical values and range.

Preferred embodiments of the present invention will be described in detail based on the accompanying drawings. Those elements having the same function in all of the drawings are respectively identified by the same reference numerals and their repetitive description will be omitted.

In the present embodiments, a MIS•FET (including MOS•FET: Metal Oxide Semiconductor Field Effect Transistor as lower conception) shown as a field effect transistor is abbreviated as "MIS", a p channel type MIS•FRT is abbreviated as "pMIS" and an n channel type MIS•FET is abbreviated as "nMIS", respectively.

Embodiment 1

FIG. 1 typically shows a fragmentary plan view of a semiconductor device discussed by the present inventors. The figure shows, as an example, a semiconductor device in which substrate bias circuits are required.

A plurality of circuit cells BC, wirings M1$a$ through M1$i$ and M2$a$ through M2$f$, and a slave switch circuit cell (hereinafter called a switch circuit cell) SW are disposed over a main surface of a semiconductor substrate (hereinafter simply called a substrate) 1S. Circuit cells BC are cells, each of which constitutes an internal circuit of the semiconductor device. For convenience herein, a group of a plurality of the circuit cells BC arranged side by side along the horizontal direction (X direction: first direction) in FIG. 1 will be referred to as a circuit cell row. The circuit cell row is disposed over the main surface of the substrate 1S in plural stages along the vertical direction (Y direction: second direction) in FIG. 1. A basic gate circuit like, for example, an inverter circuit INV or the like is formed in each circuit cell BC. The inverter circuit INV has a pMIS Qp and an nMIS Qn series-connected between wirings M1$b$ and M1$i$. The pMIS Qp is disposed in an n well NW, and the nMIS Qn is disposed in a p well PW.

The wirings (first wirings) M1$a$, M1$b$, M1$i$, M2$c$ and M2$d$ are power supply wirings for driving the internal circuits of the semiconductor device. The wirings M1$b$ and M2$d$ are power supply wirings for supplying a relatively high power supply potential Vdd, and the wirings M1$a$, M1$i$ and M2$c$ are power supply wirings for supplying a relatively low power supply potential (hereinafter called a reference voltage for distinction) Vss. The power supply potential Vdd is about 1.5V, for example. Also the reference potential Vss is a ground potential corresponding to 0 (zero) V, for example. The wirings M1$a$, M1$b$ and M1$i$ are formed in a first wiring layer. Here, portions extending along an X-direction wiring channel are illustrated as the wirings M1$a$, M1$b$ and M1$i$. The wiring (M1$b$) for the supply of the power supply potential Vdd and the wirings (M1$a$ and M1$i$) for the supply of the reference potential Vss are disposed above and below the circuit cell row so as to interpose the circuit cell row therebetween. The wirings M2$c$ and M2$d$ are formed in a second wiring layer. Here, portions extending along a Y-direction wiring channel are illustrated as the wirings M2$c$ and M2$d$. Further, the wirings M2$c$ and M2$d$ are disposed in a state where they intersect (orthogonal to) the wirings M1$a$, M1$b$ and M1$i$.

The wirings (third wirings) M2$a$ and M2$e$ are, respectively, power supply wirings for supplying substrate bias potentials Vbn and Vbp. The substrate bias potential Vbn is about 1.5V, for example. The substrate bias potential Vbp is about 3V, for example. The wirings (second wirings) M2$b$ and M2$f$ are, respectively, signal wirings for supplying control signals Vbcn and Vbcp for controlling the turning on and off of switches of the switch circuit cell. The potential of the control signal Vbcn is about 1.5V, for example, and the potential of the control signal Vbcp is about 0 (zero) V, for example. The wirings M2$a$, M2$e$, M2$b$ and M2$f$ are formed in a second wiring layer. Here, portions extending along the Y-direction wiring channel are illustrated as the wirings M2$a$, M2$e$, M2$b$ and M2$f$. The wirings M2$a$, M2$e$, M2$b$ and M2$f$ are placed from side to side so as to interpose the wirings M2$c$ and M2$d$ therebetween. Incidentally, even though the wirings, at which the power supply potential Vdd, the reference potential Vss, the substrate bias potentials Vbn and Vbp, and the control signals Vbcn and Vbcp shown in the drawings are used for the description of the embodiments (except for embodiments 3 and 4), are not shown as being connected to one another in the drawings, they are electrically connected at any points or locations in a semiconductor chip.

The switch circuit cell SW is a cell which constitutes a switch circuit for applying or unapplying the substrate bias voltages to the n wells NW and p wells PW where the circuit cells are disposed. The switch circuit cell SW has a pMIS Qps and an nMIS Qns. The pMIS Qps has p type semiconductor regions 2P1 and 2P2 for the source and drain and a gate electrode 3G1, and it is disposed in an n well NW. The p type semiconductor regions 2P1 and 2P2 are formed by introducing or implanting, for example, boron (B) into the n well NW. One semiconductor region 2P1 is electrically connected to the wiring M1$c$ through contact holes CT1. The wiring M1$c$ is further electrically connected to the wiring M2$d$ via a through hole TH1. The other semiconductor region 2P2 is electrically connected to the wiring (third wiring) M1$e$ through contact holes CT2. The wiring M1$e$ is electrically connected to the wiring M2$e$ via a through hole TH2. In addition, the wiring M1$e$ is electrically connected to n+ type semiconductor regions 4N disposed in the switch circuit cell SW and the respective circuit cells BC through a contact hole CT3, and it is electrically connected to the n wells NW therethrough. The gate electrode 3G1 is electrically connected to the wiring M1$d$. The wiring M1$d$ is electrically connected to the wiring M2$f$ via a through hole TH3. When such a pMIS Qps is turned off, the substrate bias potential Vbp is applied to the n wells NW, so that the threshold voltages of the pMISs Qp of the respective circuit cells BC can be rendered high, thus making it possible to suppress leakage currents between the sources and drains of the pMISs Qp. As a result, an increase in power consumption can be suppressed, and a thermal runaway caused by the leakage current during testing can be suppressed. On the other hand, when the pMIS Qps is turned on, the power supply potential Vdd is applied to the n wells NW, so that the threshold voltages of the pMISs Qp of the respective circuit cells BC can be reduced, thus making it possible to increase the operating speeds of the pMISs Qp.

The nMIS Qns has n type semiconductor regions 2N1 and 2N2 for the source and drain and a gate electrode 3G2, and it is disposed in a p well PW. The n type semiconductor regions 2N1 and 2N2 are formed by introducing, for example, phosphor (P) or arsenic (As) into the p well PW. One semiconductor region 2N1 is electrically connected to the wiring (third wiring) M1$f$ through contact holes CT4. The wiring M1$f$ is electrically connected to the wiring M2$a$ via a through hole TH4. In addition, the wiring M1$f$ is electrically connected to p$^+$ type semiconductor regions 4P respectively disposed in the switch circuit cell SW and the respective circuit cells BC through a contact hole CT5, and it is electrically connected to the p wells PW therethrough. The other semiconductor region 2N2 is electrically connected to the wiring M1$h$ through contact holes CT6. The wiring M1$h$ is electrically connected to the wiring M2$c$ via a through contact TH5. The gate electrode 3G2 is electrically connected to the wiring M1$g$. The wiring M1$g$ is electrically connected to the wiring M2$b$ via a through hole TH6. When such an nMIS Qns is turned off, the substrate bias potential Vbn is applied to the p wells NW, so that the threshold voltages of the nMISs Qn of the respective circuit cells BC can be rendered high, thus making it possible to suppress leakage currents between the sources and drains of the nMISs Qn. As a result, an increase in power consumption can be suppressed, and a thermal runaway caused by the leakage current during testing can be suppressed. On the other hand, when the nMIS Qns is turned on, the power supply potential Vss is applied to the p wells PW, so that the threshold voltages of the nMISs Qn of the respective circuit cells BC can be reduced, thus making it possible to increase the operating speeds of the nMISs Qn. Incidentally, the wirings M1$c$ through M1$h$ are wirings formed in the first wiring layer, and they are formed so as to extend in the X direction.

Figure 2:
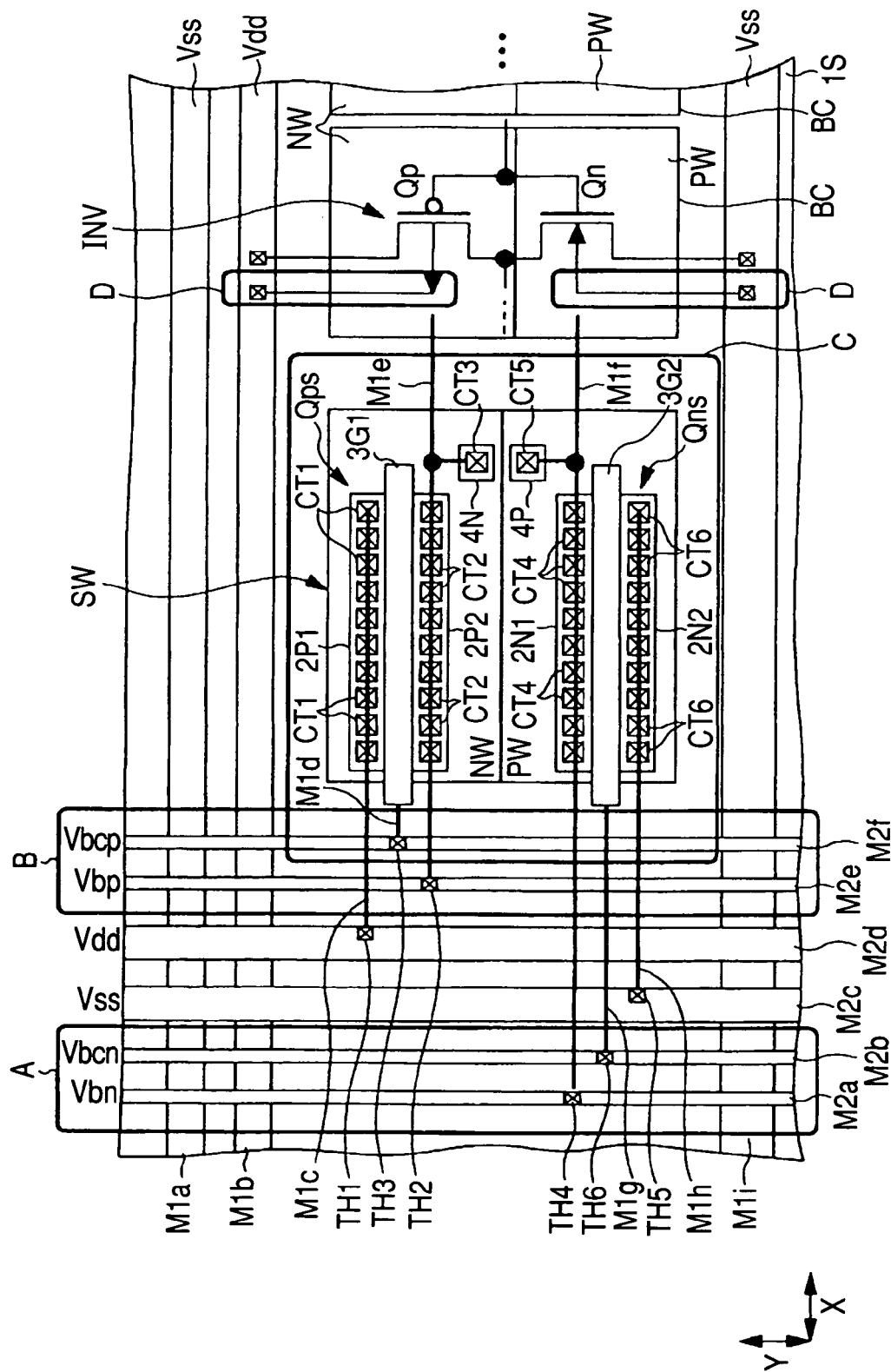
FIG. 2 is a fragmentary plan view of one technique used in a method of designing a semiconductor device as discussed by the present inventors.

Meanwhile, the next-generation semiconductor devices might often be designed while following some or a majority of design data for a predetermined semiconductor device based on the semiconductor device's design. In such a case, however, substrate bias circuits might not be needed partially or wholly. As one method in such a case, as shown in FIG. 2, there is a method for eliminating wirings M2$a$, M2$b$, M2$e$ and M2$f$ shown in areas A and B, each constituting the substrate bias circuit, and a switch circuit cell SW shown in an area C and adding wirings in areas D for every one of the circuit cells BC. In the case of this method, however, there is a need to re-design the wiring layout with the elimination of the areas A and B and perform a design change for eliminating the area C, although the semiconductor device can be designed in a short period of time as compared with re-designing all of it from the beginning. In addition, the wirings are added to 700 to 1200 circuit cells BC. Therefore, the time required to design the semiconductor device becomes long. Further, since such a substantial circuit modification in which the wirings are added for every one of the circuit cells BC is performed, the electrical characteristic greatly changes too. Therefore, the respective circuits of the semiconductor device must be re-evaluated after its design, and, hence, the time required to evaluate each circuit also becomes long. As a result, the TAT (Turn Around Time) in the fabrication of the semiconductor device becomes long.

Figure 3:
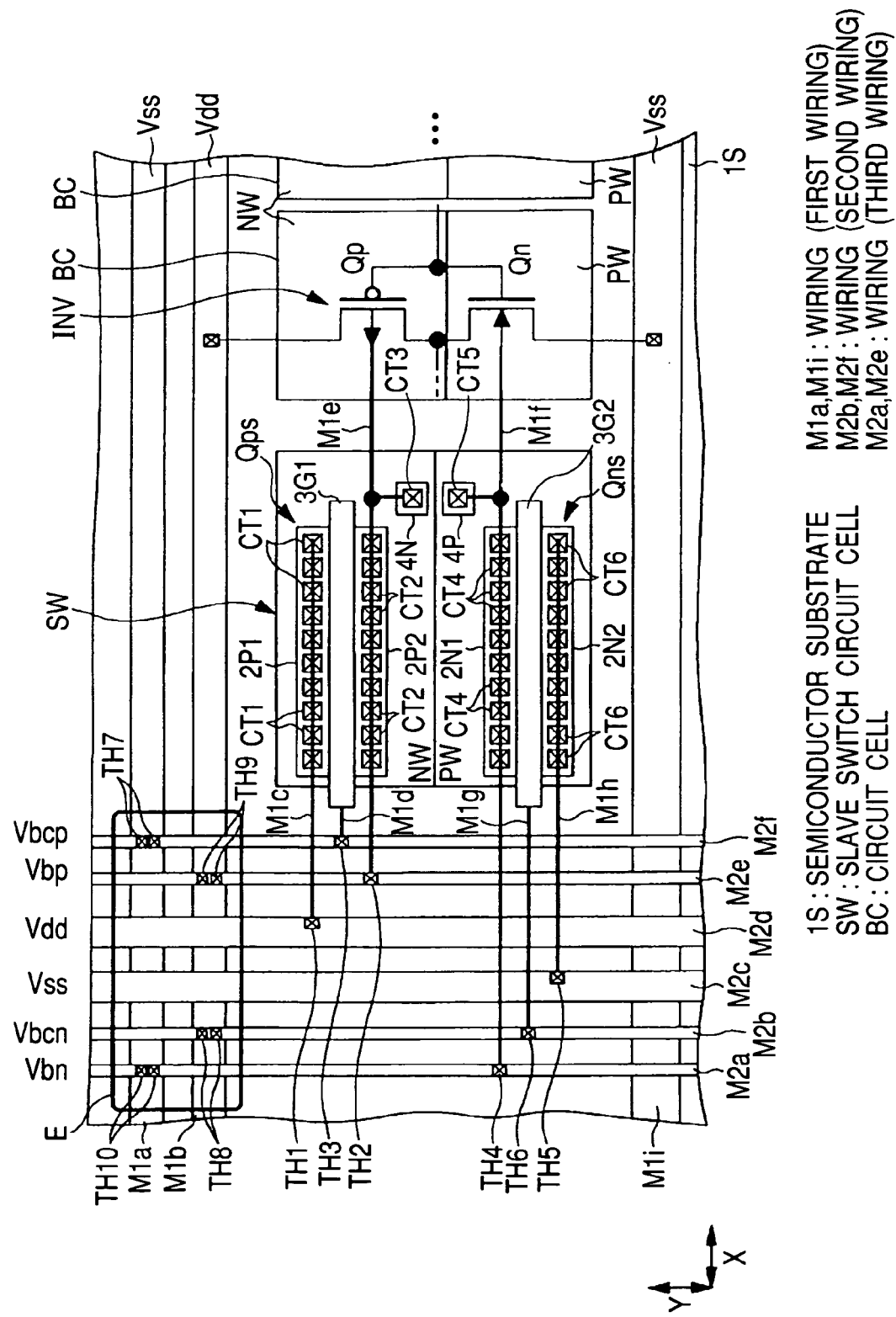
FIG. 3 is a typical fragmentary plan view depicting a semiconductor device illustrative of one embodiment of the present invention.

Thus, in the present embodiment, when design data for another semiconductor device is created while following the design data for the predetermined semiconductor device, the substrate bias circuits remain unchanged, and the on/off switching operation of the switch circuit cell SW is made invalid (still kept in an on state or off state) upon operation of the semiconductor device, such that the on/off switching operation thereof is not performed. Further, a part of the wiring connections is changed in such a manner that the voltages supplied to an n well NWL and a p well PWL of each circuit cell BC are fixed. FIG. 3 shows a specific example thereof. The change with respect to FIG. 1 appears only in a portion equivalent to an area E. That is, the wiring M2$f$ and the wiring M1$a$ are electrically connected via through holes TH7 at an intersecting point thereof. Thus, since the reference potential Vss is applied to the gate electrode 3G1 of the pMIS Qps of the switch circuit cell, the pMIS Qps is always held on, so the switch operation is made invalid. Further, the wiring M2$b$ and the wiring M1$g$ are electrically connected via through holes TH8 at an intersecting point thereof. Thus, since the power supply potential Vdd is applied to the gate electrode 3G2 of the nMIS Qns of the switch circuit cell, the nMIS Qns is always held on so that its switch operation is made invalid. Further, the wiring M2$e$ and the wiring M1$b$ are electrically connected via through holes TH9 at an intersecting point thereof. Thus, since the power supply potential Vdd is applied to the wiring M1$e$, the n well NW of each circuit cell BC is fixed to the power supply potential Vdd. Also the wiring M2$a$ and the wiring M1$a$ are electrically connected via through holes TH10 at an intersecting point thereof. Thus, since the reference potential Vss is applied to the wiring M1f, the p well PW of each circuit cell BC is fixed to the reference potential Vss.

Thus, in the present embodiment, the switch operation of the switch circuit cell SW can be invalidated merely by placement of the through holes (connecting holes) TH7 through TH10 without modifying the layout of the circuits and wirings. Besides, the potentials of the n wells NW and p wells PW of a plurality of the circuit cells BC can be fixed to the power supply potential. In the case of the design technique described with reference to FIG. 2, about two weeks are taken to change the design; whereas, according to the present embodiment, only one cell library enables the design, and the time required for the design change can be almost brought to naught, because there is no need to design a new cell library. Therefore, a QTAT (Quick Turn Around Time) for the design of the semiconductor device is enabled. Since there is no need to modify the wirings at each circuit cell BC, it is also unnecessary to re-evaluate the circuit of each circuit cell BC. Owing to these features, the next-generation semiconductor device, which follows portions that obtain high evaluations in terms of the reliability and performance of the previous-generation semiconductor device, as they are, can be manufactured in a short period of time.

Figure 4:
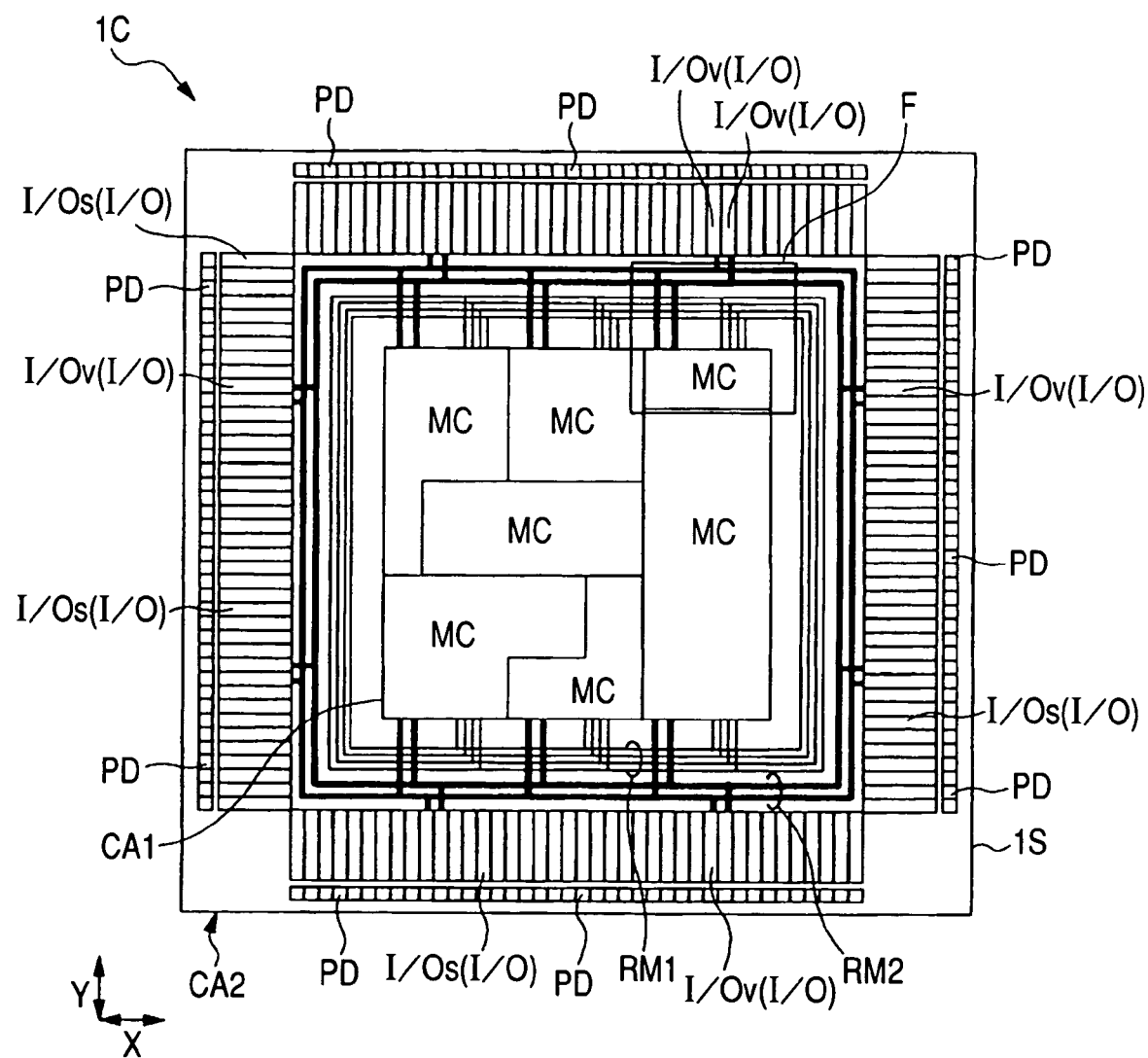
FIG. 4 is an overall plan view showing one example of a semiconductor chip constituting the semiconductor device according to the one embodiment of the present invention.
Figure 5:
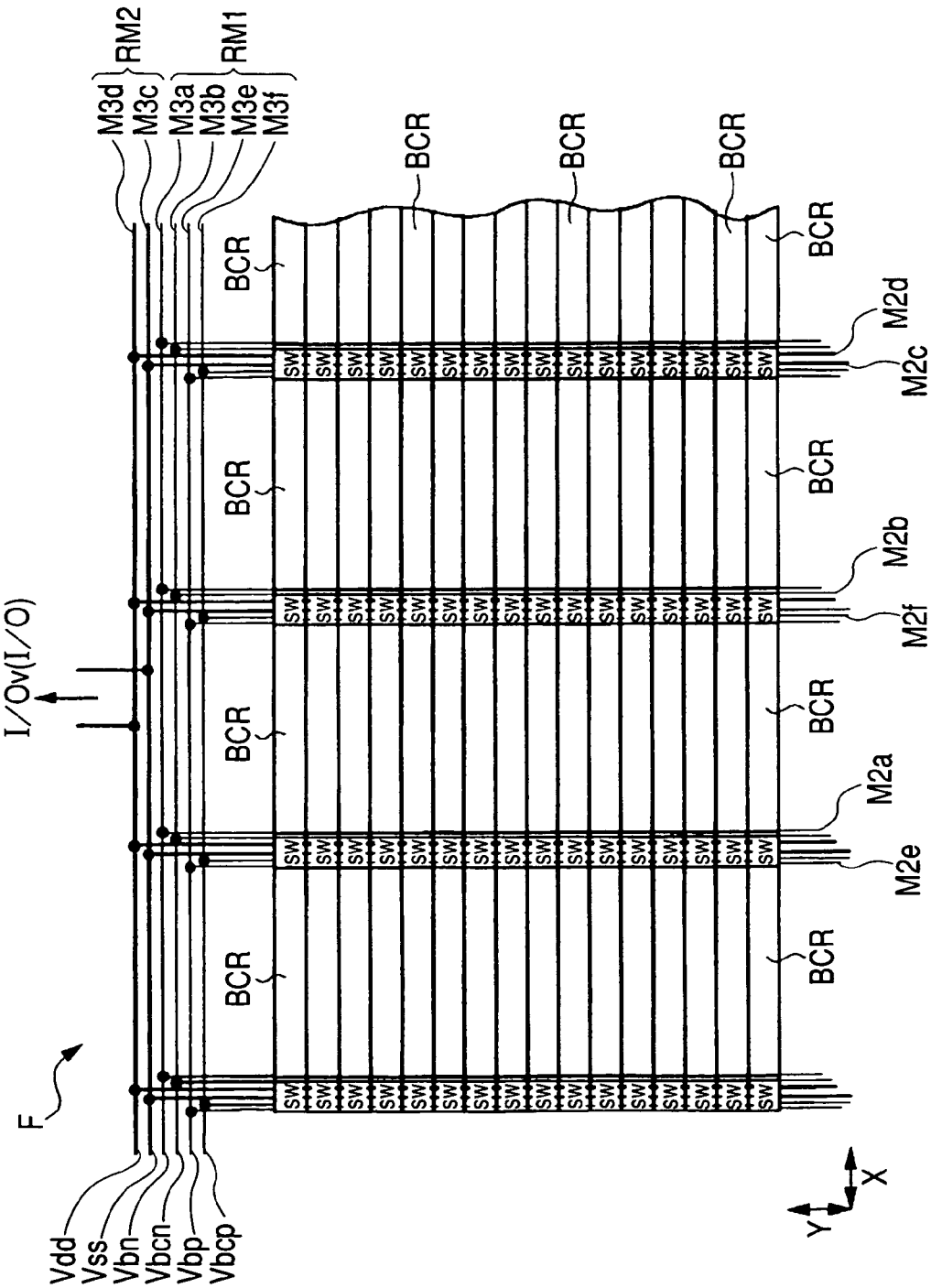
FIG. 5 is a fragmentary enlarged plan view of an area F shown in FIG. 4.

A further specific example of the semiconductor device according to the present embodiment will be explained with reference to FIGS. 4 through 13. FIG. 4 shows an overall plan view of a semiconductor chip 1C constituting an example of the semiconductor device according to the present embodiment. FIG. 5 shows a fragmentary enlarged plan view of an area F shown in FIG. 4.

The semiconductor device according to the present embodiment is an electronic component like a general-purpose IC or ASIC (Application Specific IC) or the like of the type employed in electronic equipment, like a cellular phone, a digital camera or a personal computer or the like. A plane square or quadrangular internal circuit area CA1 is disposed in the center of a plane square semiconductor chip 1C constituting the present semiconductor device. A plurality of macro cells MCs are disposed in the internal circuit area CA1. A plurality of circuit cell rows BCR are placed in each macro cell MC so as to be arranged and packed along X and Y directions as shown in FIG. 5. In each circuit cell row BCR, a plurality of circuit cells are placed side by side along the X direction as described above. Switch circuit cells SW are disposed for every circuit cell row BCR. With connections of respective circuit cells BC in such circuit cell rows BCR, logic circuits like, for example, DSP (Digital Signal Processors) or the like, and memory circuits like, for example, RAMs (Random Access Memories), ROMs (Read Only Memories) or the like are formed in the respective macro cells MC. A plurality of processors or the like in the internal circuit area CA1 perform parallel processing while simultaneously sharing a large number of instructions and data to enhance the processing performance, thereby making it possible to process desired processing, like graphic processing or the like, in real time at high speed.

A peripheral circuit area CA2 is disposed between the outer periphery of the internal circuit area CA1 and the outer periphery of the semiconductor chip 1C, both shown in FIG. 4. Wirings RM1 and RM2 are disposed so as to surround the outer periphery of the internal circuit area CA1. The wirings RM1 and RM2 are go-around or orbital wirings for the internal circuit. Of these, the wiring RM1 has wirings M3a, M3b, M3e and M3f for substrate bias circuits. The wiring M3a is a wiring electrically connected to the wiring M2a, to which the substrate bias potential Vbn is applied. The wiring M3b is a wiring electrically connected to the wiring M2b, to which the control signal Vbcn is applied. The wiring M3e is a wiring electrically connected to the wiring M2e, to which the substrate bias potential Vbp is applied. The wiring M3f is a wiring electrically connected to the wiring M2f, to which the control signal Vbcp is applied. On the other hand, the wiring RM2 includes wirings M3c and M3d for power supply. The wiring M3c is a wiring electrically connected to the wiring M2c, to which the power supply potential Vss is applied. The wiring M3d is a wiring electrically connected to the wiring M2d, to which the power supply voltage Vdd is applied. The wirings M3a through M3f are formed in a third wiring layer located above the wirings M2a through M2f. In the peripheral circuit area CA2, as shown in FIG. 4, a plurality of input/output circuit cells I/O are disposed around the outer peripheries of the wirings RM1 and RM2 and arranged side by side along the outer periphery of the semiconductor chip 1C. The input/output circuit cells I/O are divided into signal input/output circuit cells I/Os and power-supply input/output circuit cells I/Ov. Various interface circuits, like a protection circuit for prevention of electrostatic breakdown, etc. in addition to, for example, an input circuit, an output circuit, or an input/output bidirectional circuit, are formed in the signal input/output circuits I/O, respectively. A substrate bias power supply circuit is disposed in an area for each input/output circuit cell I/O. Further, a plurality of pads PD are disposed around the outer peripheries of the input/output circuit cells I/O in the peripheral circuit area CA2 of FIG. 4 and are arranged side by side along the outer periphery of the semiconductor chip 1C. The pads PD include signal pads and power supply pads. The pads PD are disposed for each input/output circuit cell I/O referred to above. The signal pads PD are disposed for the signal input/output cell I/Os, and the power supply pads PD are disposed for the power-supply input/output circuit cells I/Ov. The pads PD may be disposed in a zigzag manner. Thus, since a larger number of the pads PD can be disposed in small areas, a semiconductor device that needs a number of pins can be reduced in size.

Figure 6:
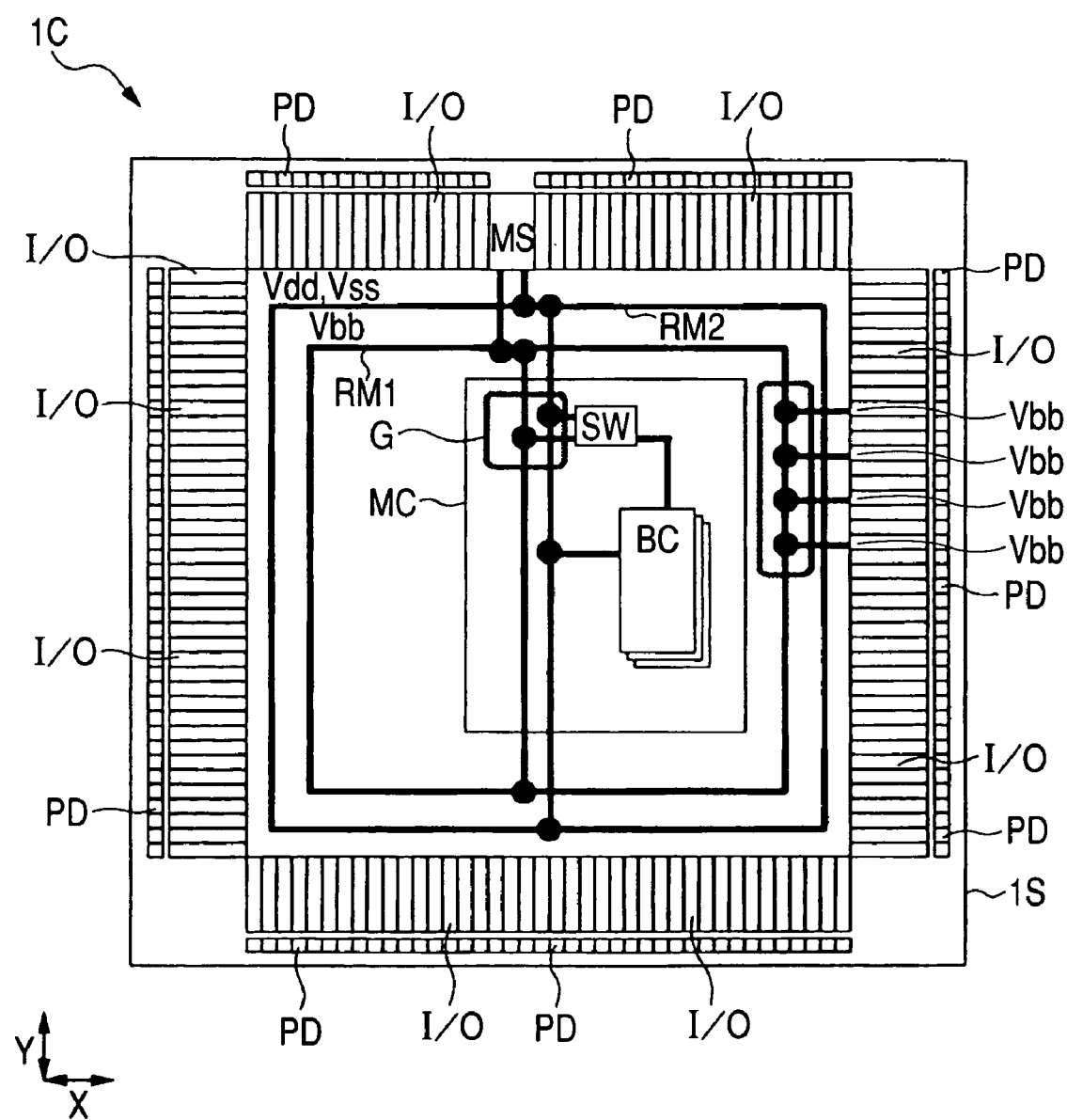
FIG. 6 is a plan view typically showing a semiconductor chip constituting a semiconductor device discussed by the present inventors.

FIG. 6 shows a typical semiconductor chip 1C where a substrate bias circuit is used. Symbol Vbb designates a substrate bias system potential which is referred to as a generic name for the substrate bias potentials Vbn and Vbp and control signals Vbcn and Vbcp. Symbol MS designates a substrate bias power supply circuit. The substrate bias power supply circuit MS is electrically connected to a switch circuit cell SW through wirings RM2 and RM1. Input/output circuit cells I/O for supplying a substrate bias control signal are electrically connected to the switch circuit cell SW through the wiring RM1. Thus, the application or non-application of the substrate bias voltages to each circuit cell BC can be controlled (see an area G shown in FIG. 6).

Figure 7:
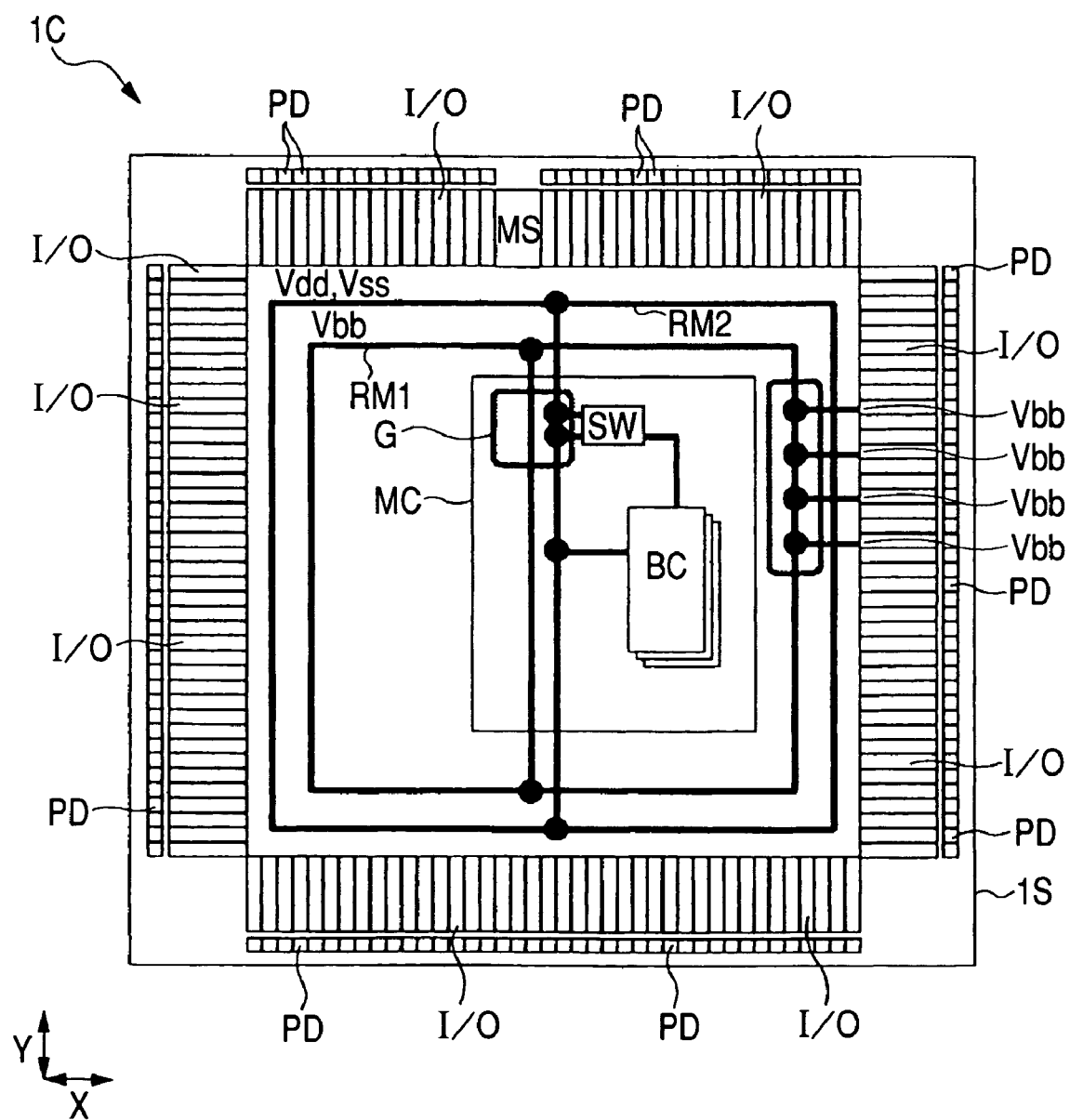
FIG. 7 is a plan view typically depicting a semiconductor chip constituting a semiconductor device illustrative of one embodiment of the present invention.

On the other hand, FIG. 7 shows a typical semiconductor chip 1C where a substrate bias circuit is not used as a whole. In FIG. 7, as compared with FIG. 6, the substrate bias power supply circuit MS is disconnected from the wirings RM2 and RM1. The wiring RM1 is not connected to a switch circuit cell SW. The wiring RM2 for a power supply potential Vdd and a reference potential Vss is connected to the switch circuit cell SW. The substrate potential for each circuit cell BC and each input/output circuit cell I/O is fixed to the power supply potential Vdd and the reference potential Vss (see the area G shown in FIG. 7). In this case, the substrate bias power supply circuit MS can be eliminated. Since large MISs, each of which belongs to a high-withstand system and has a relatively thick gate insulating film, are used as MISs constituting the substrate bias power supply circuit MS, the leakage current is small. Since the substrate bias power supply circuit can be disconnected from the whole circuit in the case of a semiconductor device wherein the substrate bias circuit is not used as a whole, the power consumption of the semiconductor device can be reduced.

Figure 8:
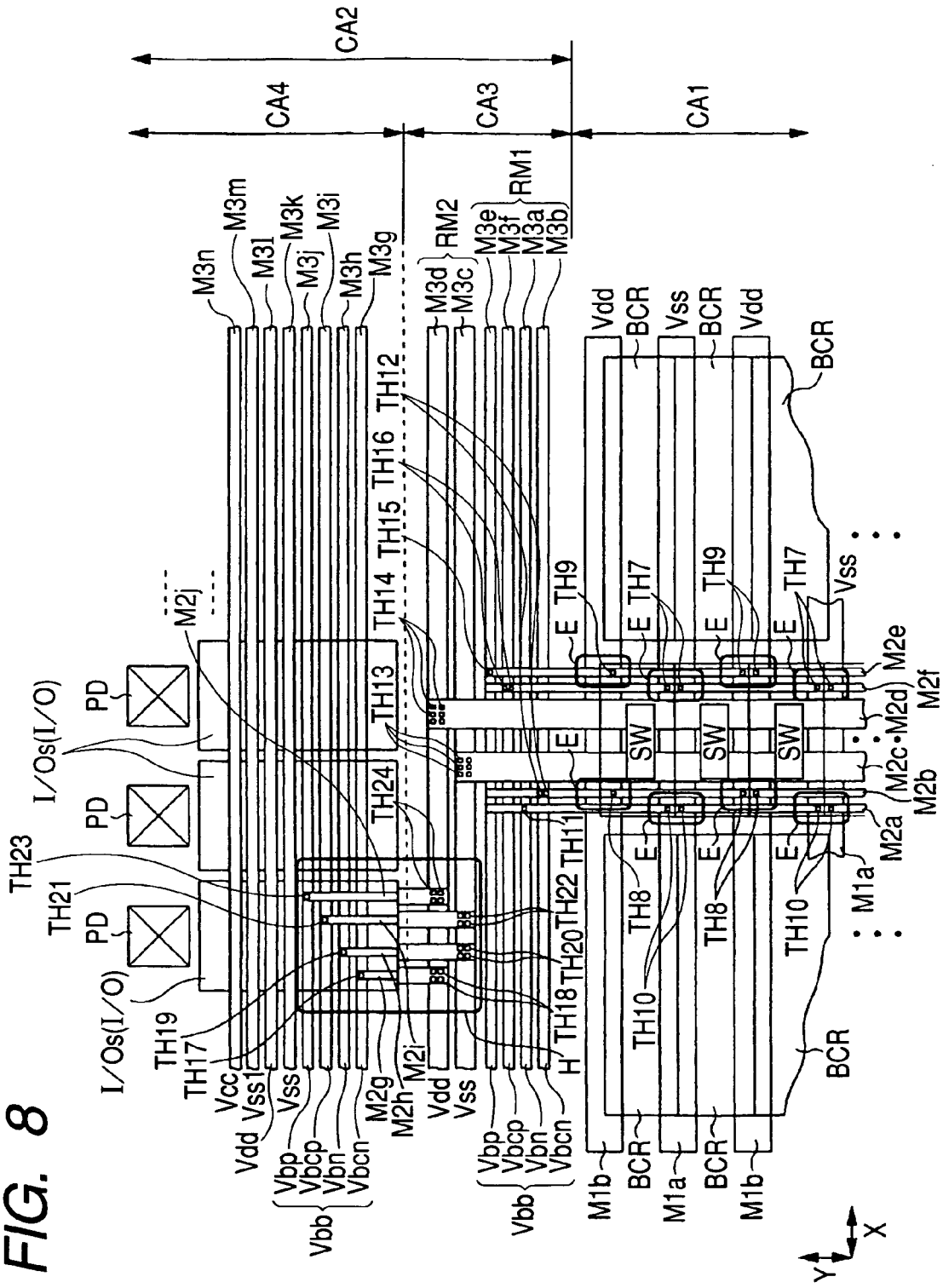
FIG. 8 is a fragmentary plan view of the semiconductor device showing the one embodiment of the present invention.

FIG. 8 shows a specific example of the design change method of FIG. 7 where no substrate bias circuit is used. Symbol CA3 designates a go-around or orbital wiring area for an internal circuit, and symbol CA4 indicates an input/output circuit area.

First of all, the design change of an area E by wiring connections in the present embodiment is identical to the one mentioned above. A wiring M2a is electrically connected to a wiring M3a via a through hole TH11, a wiring M2b is electrically connected to a wiring M3b via a through hole TH12, a wiring M2c is electrically connected to a wiring M3c via a through hole TH13, a wiring M2d is electrically connected to a wiring M3d via a through hole TH14, a wiring M2e is electrically connected to a wiring M3e via a through hole TH15, and a wiring M2f is electrically connected to a wiring M3f via a through hole TH16. Owing to such wiring connections, a substrate potential for each circuit cell row in an internal circuit area CA1 and a substrate potential for each input/output circuit cell I/O in a peripheral circuit area CA2 can be fixed to power supply potentials Vdd and Vss. According to the present embodiment, since the time taken to perform the above design change can be almost brought to naught, a QTAT for the design of the semiconductor device is enabled. Since there is no need to modify the wirings at each circuit cell BC and input/output circuit cell I/O, it is also unnecessary to re-evaluate circuits for each circuit cell BC and input/output circuit cell I/O. Owing to these features, the next-generation semiconductor device, which follows portions that obtain high evaluations in terms of the reliability and performance of the previous-generation semiconductor device, as they are, can be manufactured in a short period of time.

Next, a design change which is effected in an area H by wiring connections in the present embodiment is identical in purpose to the wiring connections indicated by the area E and shows that a substrate bias system potential Vbb is fixed to a power supply potential Vdd and a reference potential Vss in the areas for the input/output circuit cells I/O. Wiring M3g through M3n designate go-around or orbital wirings for the input/output circuits, and they extend and are disposed along the outer periphery of a semiconductor chip 1C so as surround the internal circuit area CA1. In the present example, the wirings M3g through M3n are formed in, for example, a third wiring layer. The wiring M3g is essentially a wiring to which a control signal Vbcn is applied. The wiring M3h is essentially a wiring to which a substrate bias potential Vbn is applied. Further, the wiring M3i is essentially a wiring to which the control signal Vbcn is applied, and the wiring M3j is essentially a wiring to which the substrate bias potential Vbp is applied. Also the wirings M3k through M3n are, respectively, wirings to which the substrate potential Vss, power supply potential Vdd, reference potential Vss1 and power supply potential Vcc are applied. Of these, the outermost peripheral wirings M3n and M3m are 3.3V-system power supply wirings. The power supply potential Vcc is set to, for example, about 3.3V, and the reference potential Vss1 is set to, for example, 0 (zero) V corresponding to a ground potential. In the present embodiment herein, the wiring M3g for the control signal Vbcn is connected to a wiring M2g via a through hole TH17, and, further, the wiring M2g is electrically connected to the wiring M3d via through holes TH18, whereby the wiring M3g per se is fixed to the power supply potential Vdd. The wiring M3h for the substrate bias potential Vbn is connected to a wiring M2h via a through hole TH19, and, further, the wiring M2h is electrically connected to the wiring M3c via through holes TH20, whereby the wiring M3h per se is fixed to the reference potential Vss. The wiring M3i for the control signal Vbcp is connected to a wiring M2i via a through hole TH21, and, further, the wiring M2i is electrically connected to the wiring M3c via through holes TH22, whereby the wiring M3i per se is fixed to the reference potential Vss. Further, the wiring M3i for the substrate bias potential Vbp is connected to a wiring M2j via a through hole TH23, and, further, the wiring M2j is electrically connected to the wiring M3d via through holes TH24, whereby the wiring M3j per se is fixed to the power supply potential Vdd.

In the present embodiment as described above, the substrate potentials for all circuit cells BC and all input/output circuit cells I/O in the internal circuit area CA1 of the semiconductor chip 1C can be fixed to the power supply potential Vdd and the reference potential Vss by limiting modification of the wiring layout to the minimum and simply changing the connections at one point of the area H. Even in this case, since the time taken to perform the design can be shortened as compared with re-execution of the overall design for the semiconductor device, a QTAT for the design of the semiconductor device is enabled. Since there is no need to modify the wirings at each circuit cell BC and input/output circuit cell I/O, it is also unnecessary to re-evaluate the circuits for each circuit cell BC and input/output circuit cell I/O. Accordingly, the next-generation semiconductor device, which follows portions that obtain high evaluations in terms of the reliability and performance of the previous-generation semiconductor device, as they are, can be manufactured in a short period of time.

However, although the change in connection at only one point of the area H has been performed here, it may be performed at several points in a dispersed form. It is thus possible to stabilize the potentials supplied to the substrate 1S. The wirings M3g through M3j for the substrate bias-system potential Vbb disposed in the peripheral circuit area CA2 may be electrically connected to the power-supply wirings M3l and M3k disposed in the peripheral circuit area CA2 to fix the substrate potentials for the circuit cells BC and input/output circuit cells I/O. However, since the power supply potentials to the input/output circuit cells I/O are supplied through the wirings M3l and M3k, there is a possibility that the power potentials to the input/output circuit cells I/O will change when the wirings M3g through M3j for the substrate bias-system potential Vbb are connected to the wirings M3l and M3k. It is therefore preferable that such a possibility will not be developed. The present embodiment shows where the wiring connections in both the areas E and H are provided. This is because the stability of the substrate potentials for the semiconductor chip 1C can be improved by doing so. However, it is not always necessary to perform the wiring connections in both the areas E and H. The substrate potentials can be fixed even by simply providing the wiring connections in any one of the areas. Incidentally, the wirings M2g through M2j are wirings formed in, for example, a second wiring layer, and they are formed so to extend in the Y direction.

Figure 9:
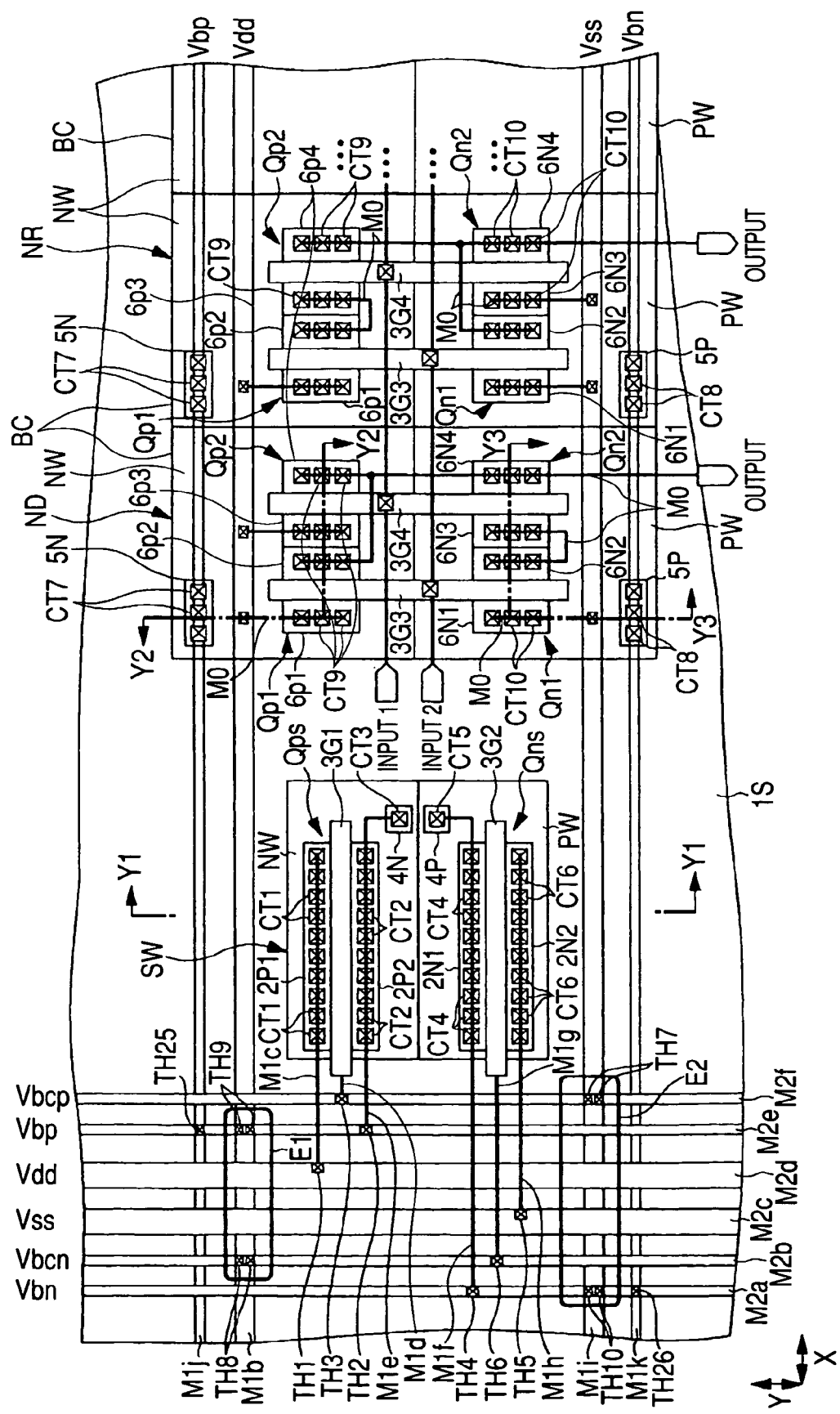
FIG. 9 is a fragmentary plan view of the semiconductor device illustrative of the one embodiment of the present invention.

FIG. 9 shows a specific example of the design change in the internal circuit area CA1 in FIG. 8. Even in this case, the design change of areas E1 and E2 by wiring (through-hole) connections is identical to the one referred to above. Wirings M1j and M1k are wirings for supplying substrate bias potentials Vbn and Vbp to n wells NW and p wells PW of respective circuit cells BC. They are formed in a first wiring layer so as to extend along the X direction. While the wiring M1*j* is electrically connected to a wiring M2*e* via a through hole TH25 at a portion where it intersects the wiring M2*e*, it is connected to $n^+$ type semiconductor regions 5N and electrically to the n wells NW through contact holes CT7. In the present embodiment, the wiring M2*e* is supplied with a power supply potential Vdd with the connection of the wiring M2*e* to a wiring M1*b* for the power supply potential Vdd via through holes TH9. Therefore, the n wells NW of the respective circuit cells BC can be fixed to the power supply potential Vdd through the wiring M1*j* electrically connected to the wiring M2*e*. While the wiring M1*k* is electrically connected to a wiring M2*a* via a through hole TH26 at a portion where it intersects the wiring M2*a*, it is connected to $p^+$ type semiconductor regions 5P and electrically to the p wells PW through contact holes CT8. In the present embodiment, the wiring M2*a* is supplied with a reference potential Vss with the connection of the wiring M2*a* to a wiring M1*i* for the reference potential Vss via through holes TH10. Therefore, the p wells PW of the respective circuit cells BC can be fixed to the reference potential Vss through the wiring M1*k* electrically connected to the wiring M2*a*. Further, since the wirings M2*a*, M2*b*, M2*e* and M2*f* for the substrate bias-system potential Vbb can be set to the power supply potential Vdd and the reference potential Vss, the substrate potentials for input/output circuit cells I/O in the same semiconductor chip can also be fixed to the power supply potential Vdd and the reference potential Vss. Thus, since the fixing of the substrate potentials for the circuit cells BC and input/output circuit cells I/O can be carried out by using only the layout or placement of the through holes TH9 and TH10 in the present embodiment, it is possible to easily perform the change of design of from a semiconductor device that needs substrate bias circuits to a semiconductor device that needs no substrate bias circuits. Thus, the time required to design the semiconductor device can be shortened. Since there is no change in circuit connections in the circuit cells BC and input/output circuit cells I/O, there is no need to re-evaluate the respective circuit cells BC and input/output circuit cells I/O. Accordingly, the next-generation semiconductor device, which follows portions that obtain high evaluations in terms of the reliability and performance of the previous-generation semiconductor device, as they are, can be manufactured in a short period of time.

FIG. 9 shows a case in which gate circuits like NAND circuits ND and NOR circuits NR or the like are formed in the circuit cells BC. The NAND circuit ND and NOR circuit NR respectively have, for example, two pMISs Qp1 and Qp2, and two nMISs Qn1 and Qn2. The pMIS Qp1 has p type semiconductor regions 6P1 and 6P2 for the source and drain, and a gate electrode 3G3. The pMIS Qp2 has p type semiconductor regions 6P3 and 6P4 for the source and drain, and a gate electrode 3G4. Further, the nMIS Qn1 has n type semiconductor regions 6N1 and 6N2 for the source and drain, and the gate electrode 3G3. The nMIS Qn2 has p type semiconductor regions 6N3 and 6N4 for the source and drain, and the gate electrode 3G4. The respective circuits are respectively formed based on the layout of wirings M0 and contact holes CT9 and CT10 in the undermost layer.

Figure 10:
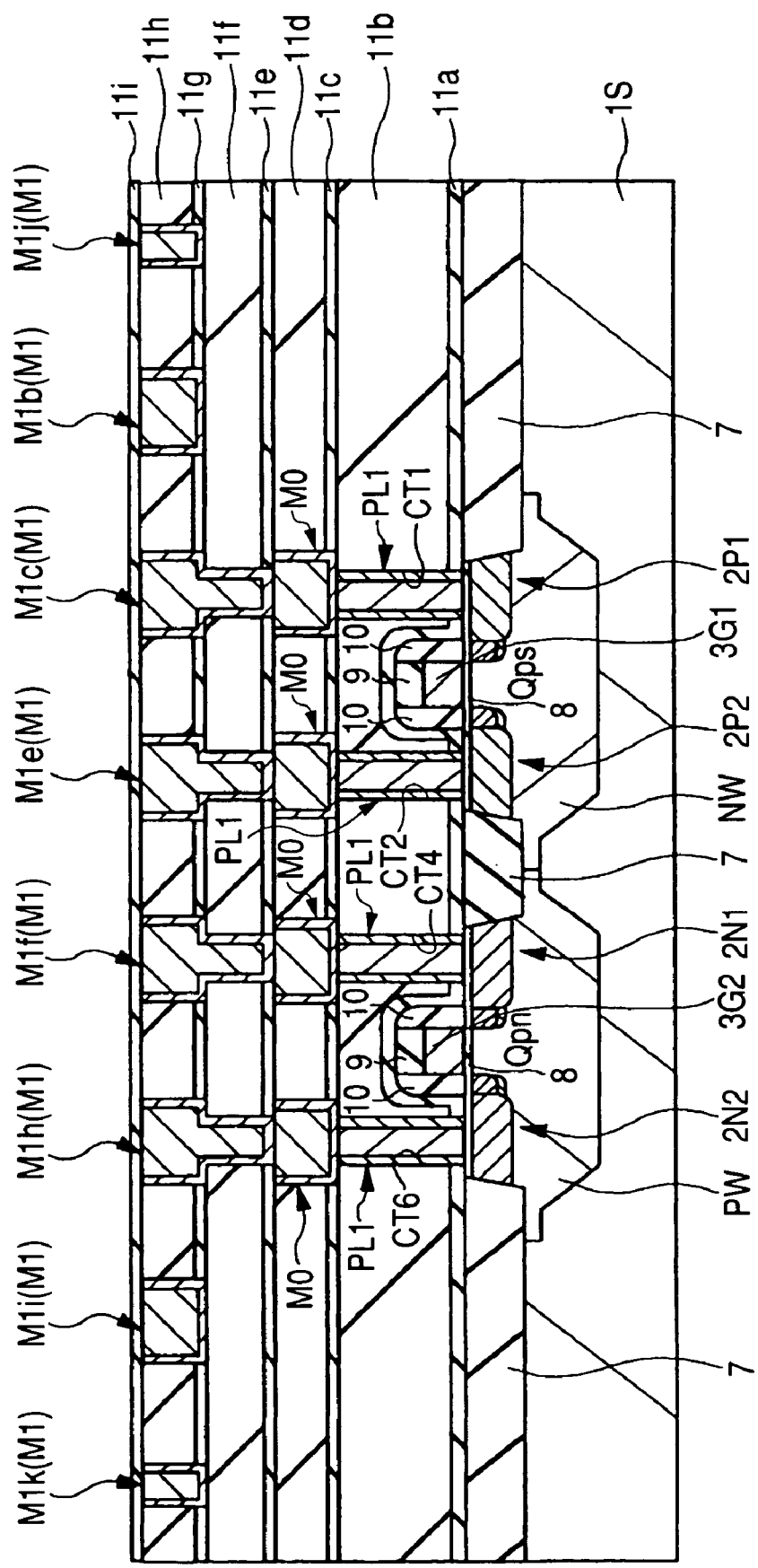
FIG. 10 is a cross-sectional view taken along line Y1—Y1 of FIG. 9.
Figure 11:
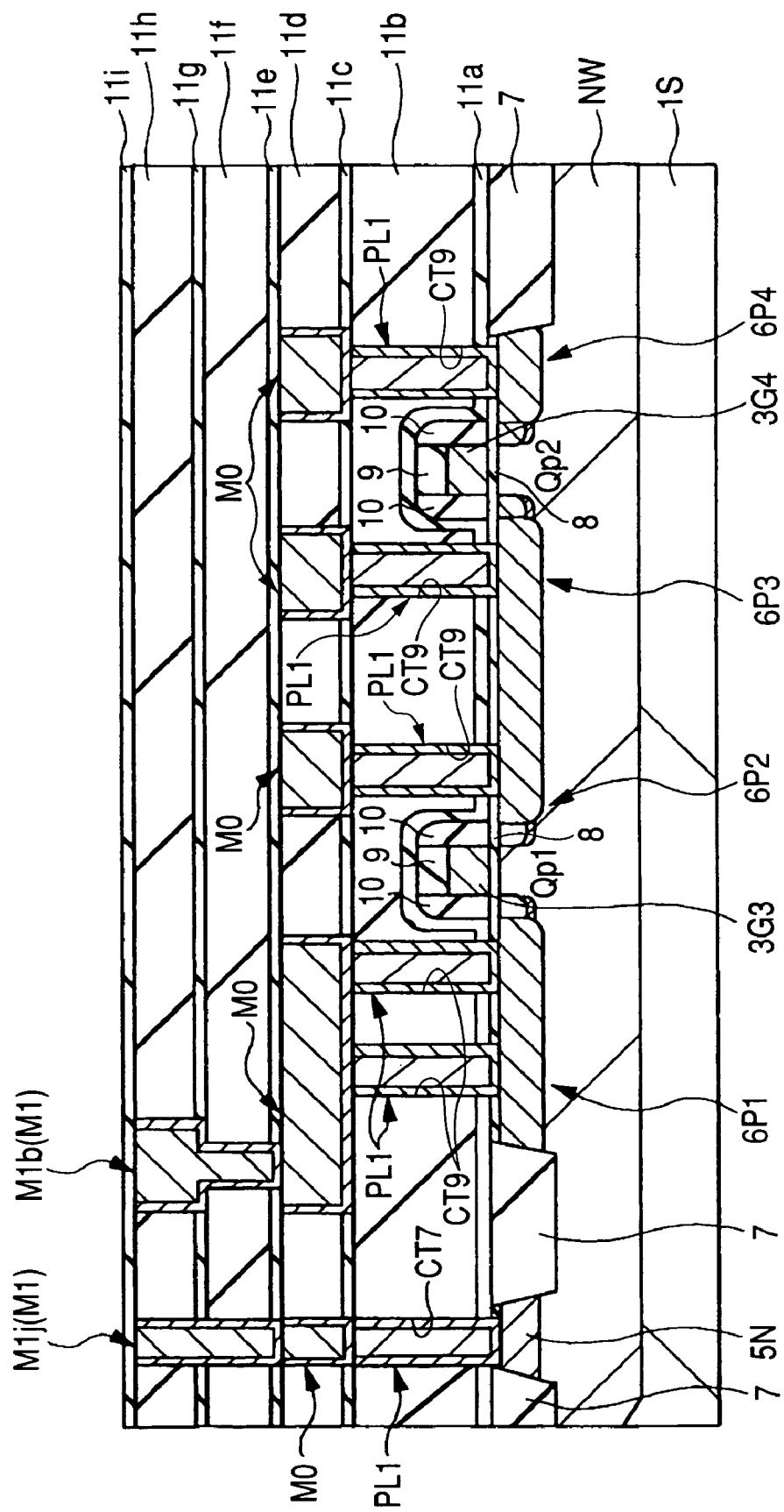
FIG. 11 is a cross-sectional view taken along line Y2—Y2 of FIG. 9.
Figure 12:
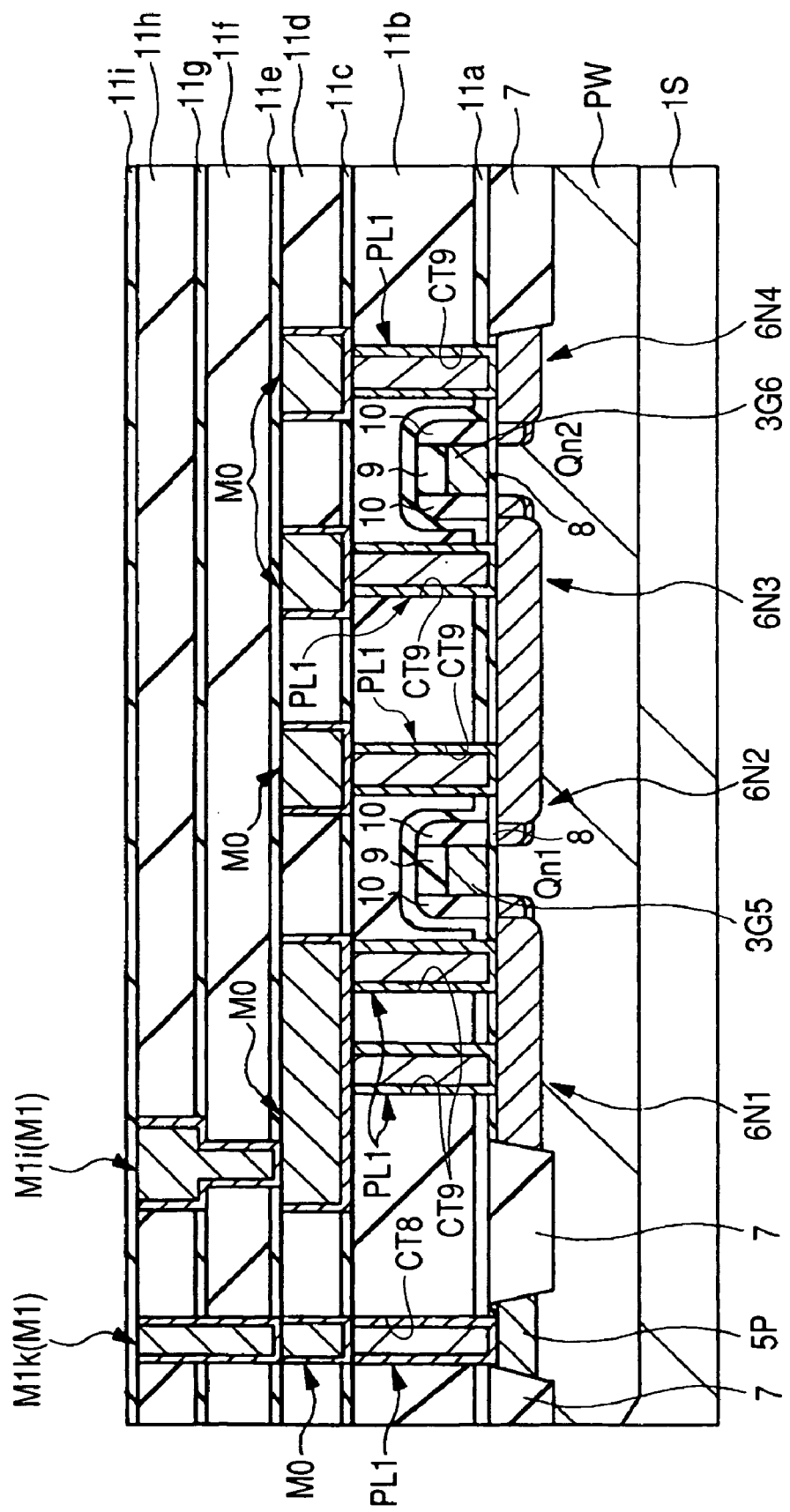
FIG. 12 is a cross-sectional view taken along line Y3—Y3 of FIG. 9.

One example of a vertical structure of FIG. 9 will now be explained with reference to FIGS. 10 through 12. FIG. 10 is a cross-sectional view taken along line Y1—Y1 of FIG. 9, FIG. 11 is a cross-sectional view taken along line Y2—Y2 of FIG. 9, and FIG. 12 is a cross-sectional view taken along line Y3–Y3 of FIG. 9.

A substrate 1S is made of, for example, p-type silicon (Si) monocrystalline. For example, trench-type separators are formed over a main surface (device forming surface) of the substrate 1S. The separators 7 are formed by embedding a silicon oxide film ($SiO_2$ or the like) into trenches formed in the substrate 1S. As an alternative to each trench-type separator 7, the separation section may be formed by a field insulating film formed by a LOCOS (Local Oxidization of Silicon) method. The pMISs Qps, Qp1, and Qp2 and nMISs Qns, Qn1 and Qn2 are formed in active regions defined by the separators 7. The pMISs Qps, Qp1, Qp2 and nMISs Qns, Qn1 and Qn2 respectively have gate insulating films 8, each made of, for example, a silicon oxide film or the like between the substrate 1S and the gate electrodes 3G1 through 3G4, in addition to the above configuration. Cap insulating films 9, each made of, for example, a silicon oxide film, are formed over the gate electrodes 3G1 through 3G4. Sidewalls 10 made of, for example, a silicon oxide film are formed over the sides of the gate electrodes 3G1 through 3G4 and the sides of the cap insulating films 9 placed thereover.

Wiring layers are formed over the main surface of the substrate 1S. The wiring layers are formed as a damascene wiring structure, for example. The damascene wiring structure is a structure wherein embedded rings are formed in wiring openings like trenches or holes or the like defined in an insulating film. The present structure is formed by, for example, depositing a conductive film over the insulating film formed with the wiring openings and thereafter removing the conductive film by polishing or the like by means of a chemical mechanical polishing (CMP) method so that the conductive film is left within the wiring openings alone. In the present embodiment, insulating films 11*a* through 11*i*, wirings M0 and M1 and plugs PL1 corresponding to some of the wiring layers are illustrated. The relatively thin insulating films 11*a*, 11*c*, 11*e*, 11*g* and 11*i* are respectively made of, for example, a silicon nitride film, and the relatively thick insulating films 11*b*, 11*d*, 11*f* and 11*h* are respectively made of, for example, a silicon oxide film. The wiring M0 and plug PL1 respectively have a structure wherein a thin barrier conductive film made of, for example, titanium nitride (TiN) or the like is formed over the outer periphery (sides and bottom surface) of a thick conductive film made of, for example, tungsten (W) or the like. Each wiring M1 has a structure wherein a thin barrier conductive film made of, for example, tantalum (Ta), tantalum nitride (TaN), titanium (Ti) or titanium nitride (TiN), or a laminated film or the like of films of two or more selected from these is formed over the outer periphery (sides and bottom surface) of a thick conductive film made of, for example, copper (Cu) or the like. The layers other than the undermost or bottom layer and the top layer are constituted with copper similar to the wirings M1 of the first wiring layer as a main wiring material. The wirings M1 are respectively electrically connected to the substrate 1S via the wirings M10.

Figure 13:
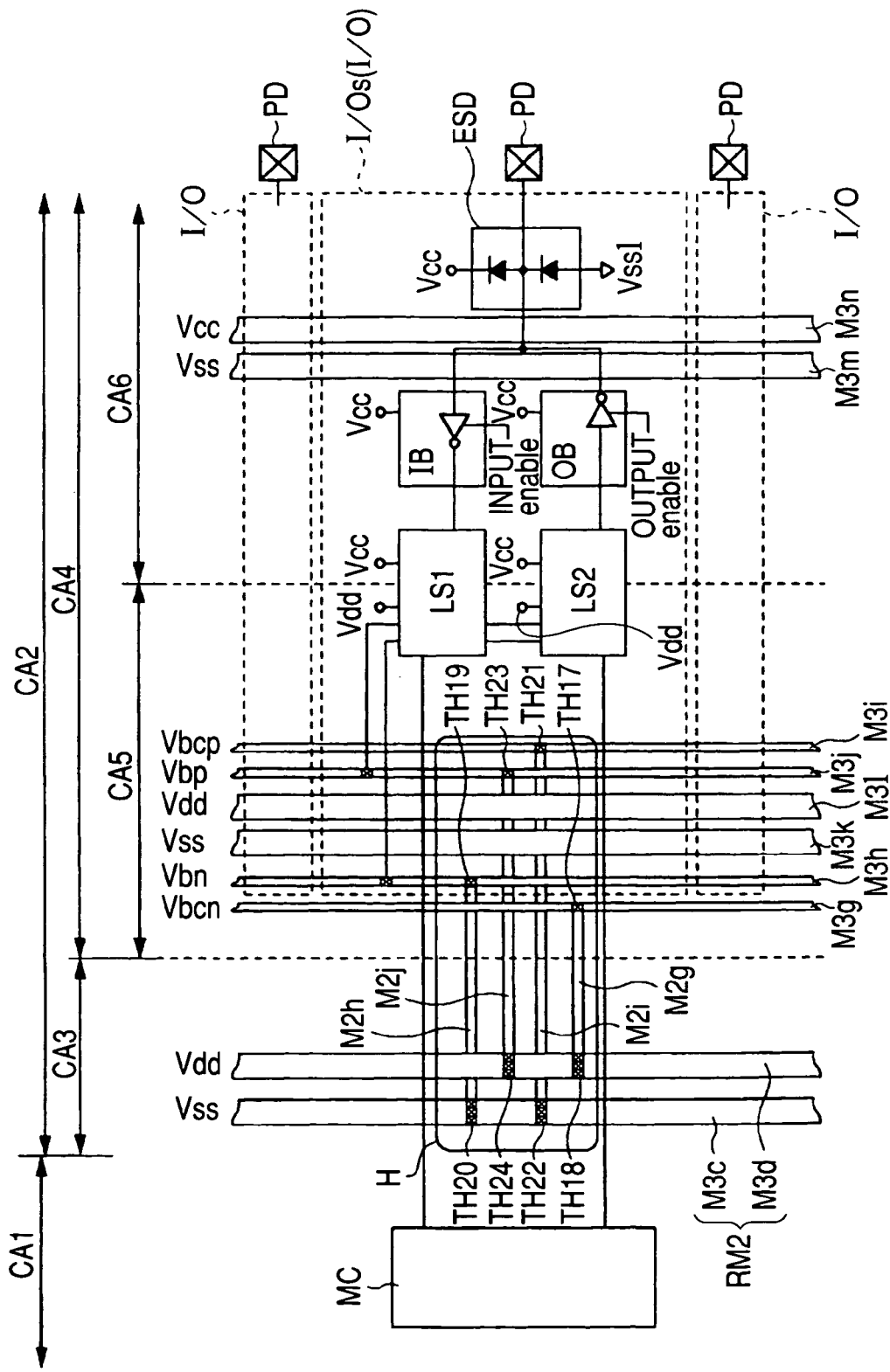
FIG. 13 is a fragmentary plan view of the semiconductor device showing the one embodiment of the present invention.

FIG. 13 shows a specific example of the design change in the peripheral circuit area CA2 of FIG. 8. Symbol CA5 in FIG. 13 indicates a low threshold area in which MISs relatively low in threshold voltage are disposed, and symbol CA6 indicates a high threshold area in which MISs relatively high in threshold voltage are disposed.

Even in this case, the change of design of the area H by wiring connections is identical to the one referred to above. In an area of an input/output circuit cell I/O at one location or spot, a substrate bias-system potential Vbb is connected to wirings for a power supply potential Vdd and a reference potential Vss, so that the substrate bias-system potentials Vbb for all circuit cells BC in an internal circuit area CA1 and all input/output circuit cells I/O in a peripheral circuit area CA2 can be fixed to the power supply potential Vdd and the reference potential Vss. It is thus possible to easily perform a change of design from a semiconductor device that needs substrate bias circuits to a semiconductor device that needs no substrate bias circuits. Thus, the time required to design the semiconductor device can be shortened. Since the wiring modification involve only one spot and there is no change in the connections in the circuit cells BC and input/output circuit cells I/O per se, there is no need to re-evaluate the respective circuit cells BC and input/output circuit cells I/O. Accordingly, the next-generation semiconductor device, taking over, as they are, portions that obtain high evaluations in terms of the reliability and performance of the previous-generation semiconductor device, can be fabricated in a short period of time.

Each of the input/output circuit cells I/O collectively include a series of circuits necessary for implementing the interface between an internal circuit and the outside. The interface between an external signal (e.g., 3.3V) and an internal signal (e.g., 1.5V) is performed via the input/output circuit cell I/O. Therefore, it is necessary to dispose the input/output circuit cells I/O in the vicinity of pads PD and supply at least two types of power supply voltages to the input/output circuit cells I/O. A protection circuit area ESD is an area in which a circuit is provided for protecting the internal circuit from an excessive voltage like electrostatic breakdown or the like. In the present embodiment, protective diodes are illustrated as a protection circuit. An input buffer circuit area IB and an output buffer circuit area OB are areas in which buffer circuits necessary for the interface between internal circuits and the outside are disposed. They operate at a power supply voltage of about 3.3V, for example. A level shifter circuit area LS1 for input is an area in which a circuit for converting a voltage level of an input signal to a voltage level at each internal circuit is disposed. The level shifter circuit area LS1 has, for example, a portion operated at a power supply voltage of about 1.5V, and a portion operated at a power supply voltage of about 3.3V. On the other hand, a level shifter circuit area LS2 for output is an area in which a circuit for converting a voltage level of a signal outputted from the internal circuit to a voltage level at the outside is disposed. The level shifter circuit area LS2 has, for example, a portion operated at a power supply voltage of about 1.5V, and a portion operated at a power supply voltage of about 3.3V. Switch circuit cells SW, each having a configuration similar to the above, are disposed in the level shifter circuit areas LS1 and LS2 of the respective input/output circuit cells I/O. pMISs constituting the circuits in each peripheral circuit areas CA2 are disposed in n well regions, and nMISs are disposed in p well regions. n wells and p wells in the peripheral circuit areas CA2 are circularly disposed along the outer periphery of a semiconductor chip 1C.

Embodiment 2

An embodiment 2 will be explained as an example in which since there is a case in which substrate biases are used in pMISs and nMISs of each memory cell even in the case of a memory circuit like an SRAM (Static Random Access Memory) or the like, substrate bias circuits in such a case are invalidated.

Figure 14:
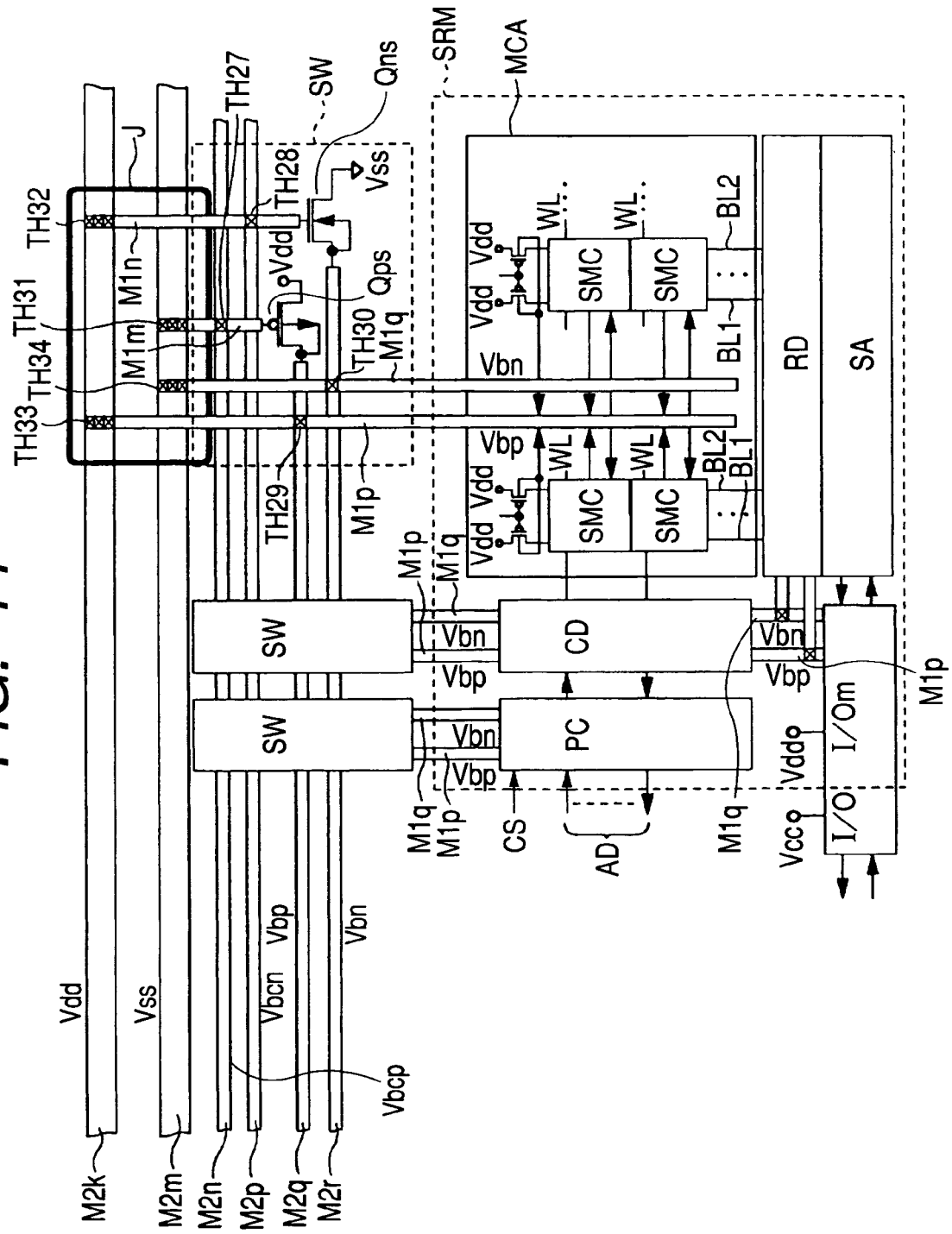
FIG. 14 is a fragmentary plan view typically showing a semiconductor device having an SRAM module according to another embodiment of the present invention.
Figure 15:
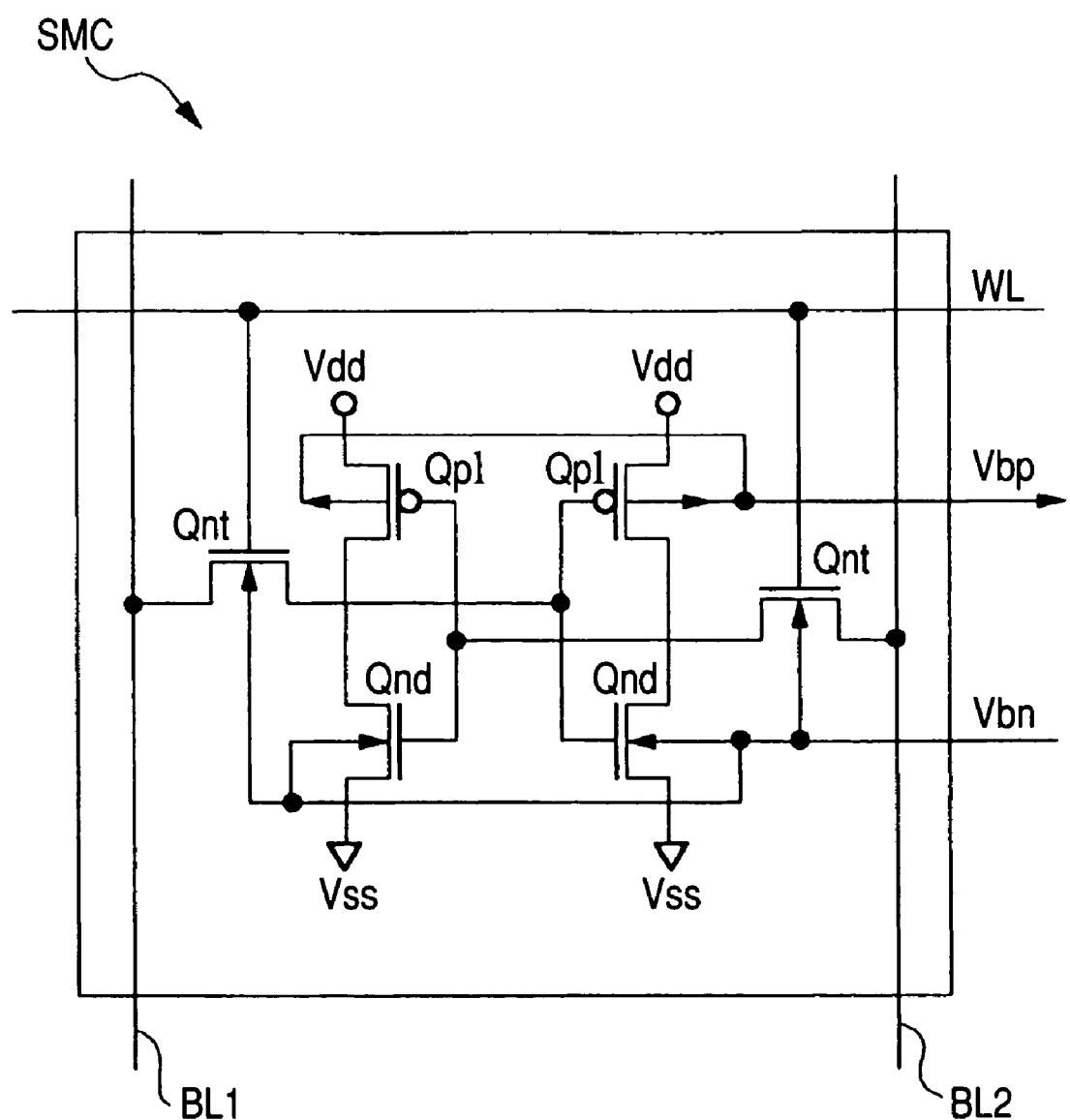
FIG. 15 is a circuit diagram depicting one example of a circuit configuration of a memory cell of the SRAM module shown in FIG. 14.

FIG. 14 is plan view typically showing a semiconductor device having an SRAM module SRM, and FIG. 15 is a circuit diagram showing one example of a circuit configuration of each memory cell SMC of the SRAM module SRM shown in FIG. 14.

The SRAM module SRM will first be explained. The SRAM module SRM has a memory cell array MCA, a row decoder circuit area CD, an indirect peripheral circuit area PC, a column decoder circuit area RD, a sense amplifier circuit area SA, and an input/output circuit cell I/Om lying within the module. In the memory cell array MCA, a plurality of the memory cells SMC are disposed in the neighborhood of intersecting points of word lines WL and bit lines BL1 and BL2. For instance, a 6 MIS type memory cell SMC is illustrated in FIG. 15. That is, the memory cell SMC includes drive nMISs Qnd, load pMISs Qp1, and transfer nMISs Qnt, which are respectively provided two by two. Each MIS of the input/output circuit cell I/O is set lower than that of the input/output circuit cell I/O, whose threshold voltage is driven at a power supply of 3.3V. In such an SRAM module SRM, substrate bias potentials Vbn and Vbp are supplied to wells for the respective MISs of the respective memory cells SMC, the row decoder circuit area CD, the indirect peripheral circuit area PC and the input/output circuit cell I/Om. Incidentally, mutually inverted signals are transmitted over the bit lines BL1 and BL2. Symbol CS indicates a chip select signal, and symbol AD indicates an address signal.

Wirings and a substrate bias circuit system will next be described. A wiring M2k is used for supplying a power supply potential Vdd, and a wiring M2m is used for supplying a reference potential Vss. A wiring M2n is essentially used for transmitting a control signal Vbcp for each substrate bias circuit. The wiring M2n is connected to a wiring M1m via a through hole TH27 and is electrically connected to a gate electrode of a pMIS Qps of a switch circuit cell SW through the wiring M1m. A wiring 2p is essentially used for transmitting a control signal Vbcn for each substrate bias circuit. The wiring 2p is connected to a wiring M1n via a through hole 28 and is electrically connected to a gate electrode of an nMIS Qns of the switch circuit cell SW through the wiring M1n. A wiring M2q is essentially used for supplying a substrate bias potential Vbp and is electrically connected to the gate of the switch circuit cell SW. A wiring M2r is essentially used for supplying a substrate bias potential Vbn and is electrically connected to the drain of the nMIS Qns of the switch circuit cell SW. These wirings M2k, M2m, M2n, and M2p through M2r are formed in a second wiring layer. Also the wirings M1m and M1n are formed in a first wiring layer. Wirings M1p and M1q, which intersect (are orthogonal to) these wirings M2k, M2m, M2n and M2p through M2r, are respectively used essentially for supplying the substrate bias potentials Vbp and Vbn to n wells of respective pMISs of the respective memory cells SMC, the row decoder circuit area CD, the indirect peripheral circuit area PC and the input/output circuit cell I/Om and p wells of respective nMISs thereof. The wiring M1p is electrically connected to the wiring M2q via a through hole TH29, and the wiring M1q is electrically connected to the wiring M2r via a through hole TH30. Incidentally, although the wirings M1p and M1q for the memory cell array MCA are illustrated one by one to make it easy to see then in the drawings, a plurality of wirings M1p and M1q are actually provided.

The above-described configuration corresponds to a configuration in which the semiconductor device which needs substrate bias circuits originally has them. A description will be made here of an example in which substrate biases become unnecessary. In this case, a design change is made by changing only the layout of wirings (through holes) in an area J in the present embodiment 2. That is, the wirings M2m and M1m are electrically connected to each other via through holes TH31. Consequently, the pMIS Qps of the switch circuit cell is always held on so that its switch operation is invalidated. The wirings M2k and Min are electrically connected to each other via through holes TH32. Thus, the nMIS Qns of the switch circuit cell is always held on so that its switch operation is invalidated. Further, the wirings M2k and Mlp are electrically connected to each other via through holes TH33. Thus, since the power supply potential Vdd is applied to the wiring Mlp, the n wells of the pMISs of the memory cell array MCA, the row decoder circuit area CD, the indirect peripheral circuit area PC, the column decoder circuit area RD, the sense amplifier circuit area SA, and the input/output circuit cell I/Om lying within the module are fixed to the power supply potential Vdd. The wirings M2m and Mlq are electrically connected to each other via through holes 34. Thus, since the reference potential Vss is applied to the wiring Mlq, the p wells PW of the nMISs of the memory cell array MCA, the row decoder circuit area CD, the indirect peripheral circuit area PC, the column decoder circuit area RD, the sense amplifier circuit area SA, and the input/output circuit cell I/Om lying within the module are fixed to the reference potential Vss.

In the present embodiment as described above, the switch operation of the switch circuit cell SW can be invalidated and the potentials of the n and p wells of the SRAM module SRM can be fixed by only providing the through holes (connecting holes) TH31 through TH34 without modifying the layout of the circuits and wirings. Thus, since the time taken to perform the design change of the semiconductor device having the SRAM can be almost brought to naught, QTAT (Quick Turn Around Time) for the design thereof is enabled. Since there is no need to modify the wirings at the SRAM module SRM, it is also unnecessary to re-evaluate circuits for the SRAM module SRM. Owing to these features, the next-generation semiconductor device having an SRAM module can be fabricated in a short period of time, in a state of taking over points that obtain high evaluations in terms of the reliability and performance of the previous-generation semiconductor device having an SRAM module, as they are.

Embodiment 3

The embodiment 3 will be explained as an example in which the supply of substrate bias power to only some circuit areas of a plurality of circuit areas (macro cells or modules) in a semiconductor chip is made valid, and the substrate bias power supplied to for other circuit areas is fixed to a power supply potential and a reference potential or the like to invalidate them.

Figure 16:
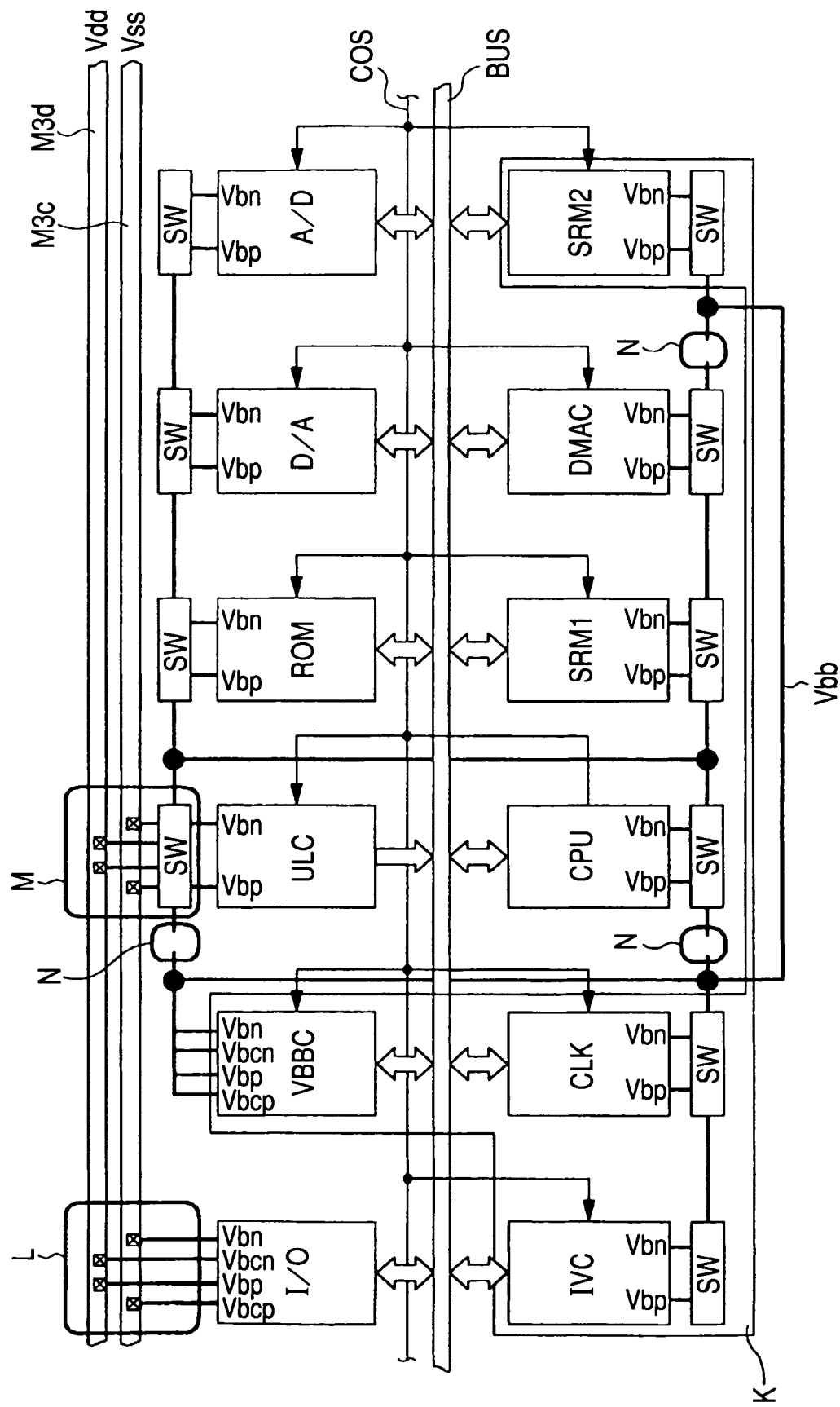
FIG. 16 is a block diagram typically showing an essential part of a semiconductor device illustrative of a further embodiment of the present invention.

FIG. 16 typically shows an essential part of a semiconductor device according to the present embodiment 3. For example, an input/output circuit cell I/O, an interrupt voltage controller IVC, a substrate bias controller VBBC, a clock generator CLK, another controller UCL, a central processing unit CPU, a ROM module ROM, a first SRAM module SRM1, a digital-to-analog circuit D/A, a DMA (Direct Memory Access Controller) controller DMAC, an analog-to-digital circuit A/D, and a second SRAM module SRM2 constructing an SOC (System On Chip) are shown in the drawing. Symbol BUS indicates an address/data bus, and symbol COS indicates a control signal wiring.

Substrate biases are applied to the respective circuits in an area K, and no substrate biases are applied to the circuits in areas other than the area K. Substrate potentials are fixed to a power supply potential Vdd and a reference potential Vss in a manner similar to the embodiments 1 and 2. The method of designing a circuit group (circuit group which invalidates the substrate bias power supplies) that does not use substrate bias circuits is identical to the embodiments 1 and 2. The present embodiment shows, as an example, a case in which the substrate biases are fixed with areas L and M in the same manner as mentioned above. Namely, as to the input/output circuit cell I/O, a substrate bias-system potential Vbb for all input/output circuit cells I/O is fixed to the power supply potential Vdd and reference potential Vss at one spot in the area L. As to the circuit group for invalidating the substrate bias power supplies, the substrate bias-system potential Vbb is fixed to the power supply potential Vdd and the reference potential Vss collectively at one spot in the area M. In any case, a substrate bias potential Vbn and a control signal Vbcp are fixed to the reference potential Vss, and a substrate bias potential Vbp and a control signal Vbcn are fixed to the power supply potential Vdd. On the other hand, as to a circuit group (circuit group for validating substrate bias power supplies) using substrate bias circuits, a substrate bias-system potential Vbb thereof is separated from the substrate bias-system potential Vbb of the circuit group for invalidating the substrate bias power supplies, as indicated in an area N. That is, the substrate bias power supply systems are set so as to include two systems. Thus, even if the circuit group for validating the substrate bias power supplies and the circuit group for invalidating the same exist within the same semiconductor chip, the present embodiment is capable of flexibly coping with it. Accordingly, the present embodiment 3 is capable of obtaining an advantageous effect similar to that of the embodiments 1 and 2.

Embodiment 4

The embodiment 4 will be explained as an example in which substrate bias power supplies are made valid for predetermined elements of a plurality of elements within a semiconductor chip, and substrate bias power supplies for other elements are fixed to a power supply potential or a reference potential or the like and made invalid. A description will now be made of a case in which substrate bias power supplies for pMIS or nMIS, for example, are fixed. When the threshold voltage of the pMIS or nMIS is designed to be high, only substrate bias power supplies of a pMIS or a nMIS designed to be low in threshold value are made valid to thereby control the threshold value of each MIS that is low in threshold value. It is thus possible to reduce the power consumption of the semiconductor device.

FIG. 17 shows indexes used upon determining whether the substrate bias power supplies are made valid or invalid. Incidentally, Vth in the FIG. 10 means threshold values. When both nMIS and pMIS are high in threshold value, the substrate bias power supplies become unnecessary. In this case, the substrate bias-system potential Vbb (substrate bias potentials Vbn and Vbp and control signals Vbcn and Vbcp) for each of the nMIS and pMIS is fixed to the power supply potential Vdd and the reference potential Vss in a manner similar to the embodiments 1 through 3. When the nMIS is high in threshold value and the pMIS is low in threshold value, the supply of the substrate bias power supplies to the pMIS is required, but the supply thereof to the nMIS is not needed. Therefore, the substrate bias-system potential Vbb (substrate bias potential Vbn and control signal Vbcn) for the nMIS is fixed to the power supply potential Vdd and the reference potential Vss in a manner similar to the embodiments 1 through 3. When the nMIS is low in threshold value and the pMIS is high in threshold value, the supply of the substrate bias power supplies to the nMIS is needed but the supply thereof to the pMIS is not needed. Therefore, the substrate bias-system potential Vbb (substrate bias potential Vbp and control signal Vbcp) for the pMIS is fixed to the power supply potential Vdd and the reference potential Vss in a manner similar to the embodiments 1 through 3. Further, when both the nMIS and pMIS are low in threshold value, the substrate bias power supplies are necessary for both the nMIS and pMIS.

Figure 18:
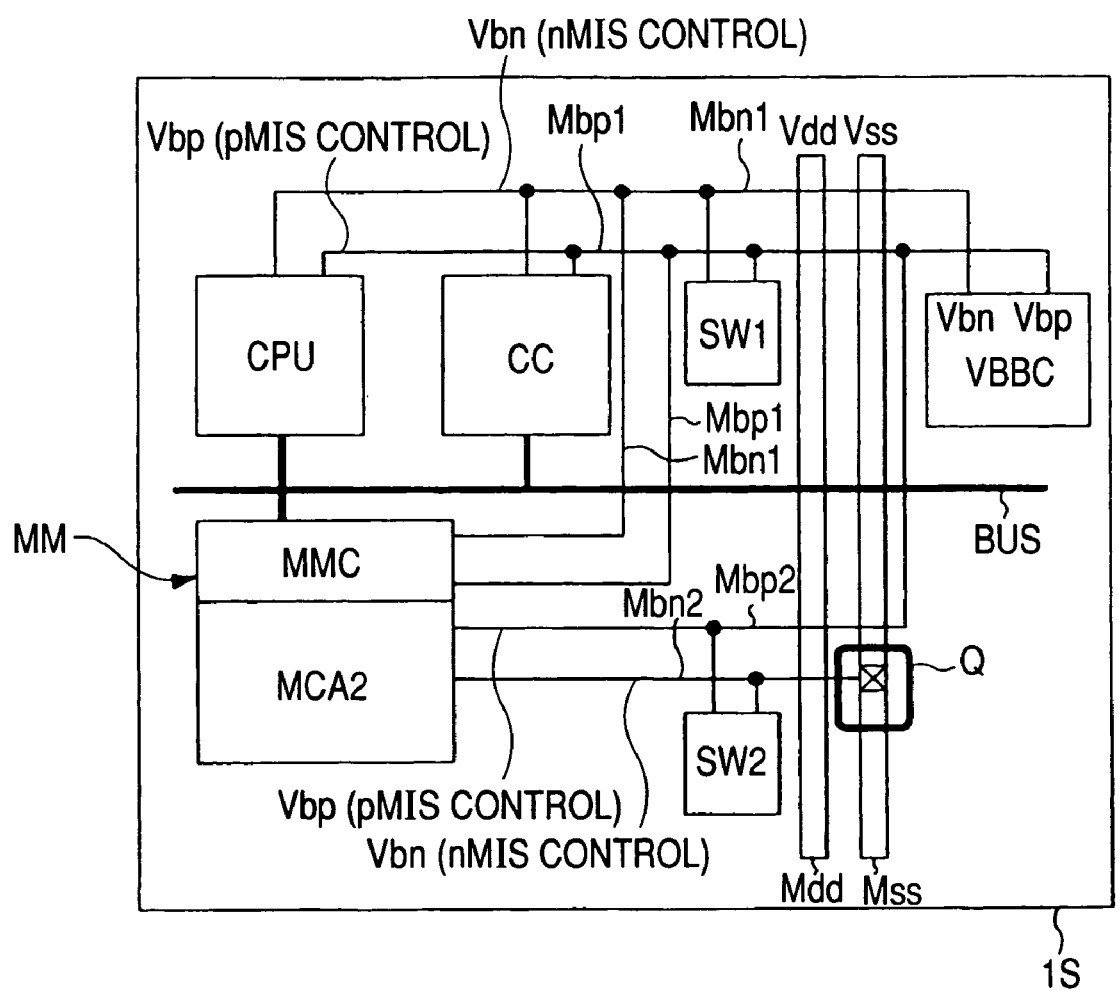
FIG. 18 is a block diagram typically showing a semiconductor device illustrative of a still further embodiment of the present invention.

FIG. 18 typically shows a specific example of the semiconductor device according to the embodiment 4. Symbol Mdd indicates a wiring for supplying a power supply potential Vdd, symbol Mss indicates a wiring for supplying a reference potential Vss, symbols Mbp1 and Mbp2 indicate wirings for supplying a substrate bias potential Vbp, symbol Mbn1 indicates a wiring for supplying a substrate bias potential Vbn, and symbol Mbn2 indicates a wiring provided to essentially supply a substrate bias potential Vbn.

In the present embodiment, all of the nMISs and pMISs for a central processing unit CPU, a control circuit CC and a memory control circuit MMC of a memory module MM are respectively set as MISs that are low in threshold value. nMISs for a memory cell array MCA2 of the memory module MM are set as MISs that are high in threshold value, and pMISs therefor are set as MISs that are low in threshold value. In this case, the substrate bias voltages are suitably applied to the nMISs and pMISs of the central processing unit CPU, control circuit CC and memory control circuit MMC of the memory module MM by use of a switch circuit cell SW1 of a substrate bias circuit to thereby control the operations of their nMISs and pMISs. Substrate bias voltages are suitably applied to the pMISs of the memory cell array MCA2 of the memory module MM by use of a switch circuit cell SW2 of a substrate bias circuit to thereby control the operations of the pMISs. Upon standby of the semiconductor device, for example, the substrate bias power supplies are supplied to the nMISs and pMISs of the central processing unit CPU, control circuit CC and memory control circuit MMC of the memory module MM, and the pMISs of the memory cell array MCA to increase the threshold voltages, thereby suppressing leakage currents. It is thus possible to reduce the power consumption of the semiconductor device. On the other hand, since there is no need to supply the substrate bias-system potential Vbb to each nMIS of the memory cell array MCA2 of the memory module MM, the wiring Mbn2 for the substrate bias potential Vbn is connected to the wiring Mss to thereby fix its potential to the reference potential Vss.

Thus, in the present embodiment 4, when the MISs that are low in threshold value and the MISs that are high in threshold value exist in the same semiconductor chip, the substrate biases are applied to the MISs that are low in threshold value to control their operations, whereas the supply of the substrate bias power supplies to the MISs that are high in threshold value is made invalid. Thus, the leakage current can be suppressed with respect to the MISs that are low in threshold value. In the case of the MISs that are high in threshold value, the substrate bias circuits (power supplies and switches) can be separated from the whole circuit of the semiconductor device. It is therefore possible to reduce the overall power consumption of the semiconductor device. In the present embodiment 4, the design for invalidation of each substrate bias circuit can be performed in a short period of time, and its re-evaluation also is unnecessary in a manner similar to the embodiments 1 through 3. Even in the case of a semiconductor device in which the circuits that need the substrate bias circuit and the circuits that do not need the substrate bias circuit are provided over the same semiconductor chip, the time required to fabricate it can be shortened.

Embodiment 5

The embodiment 5 involves a method of performing a design change by substituting each switch circuit cell with a connecting cell where substrate bias circuits are unnecessary.

Figure 19:
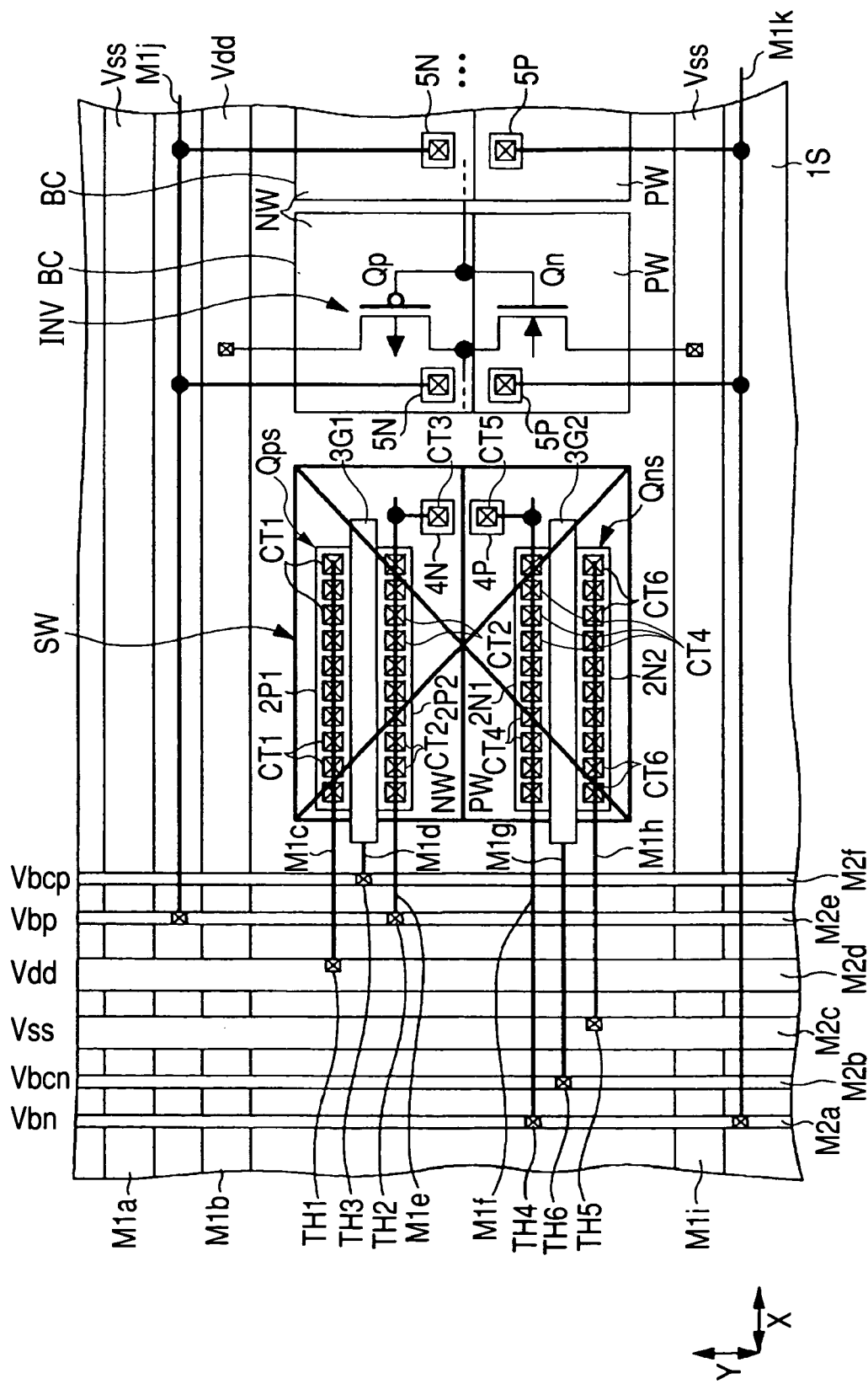
FIG. 19 is a fragmentary plan view of a semiconductor substrate illustrating a method of designing a semiconductor device, according to a still further embodiment of the present invention.
Figure 20:
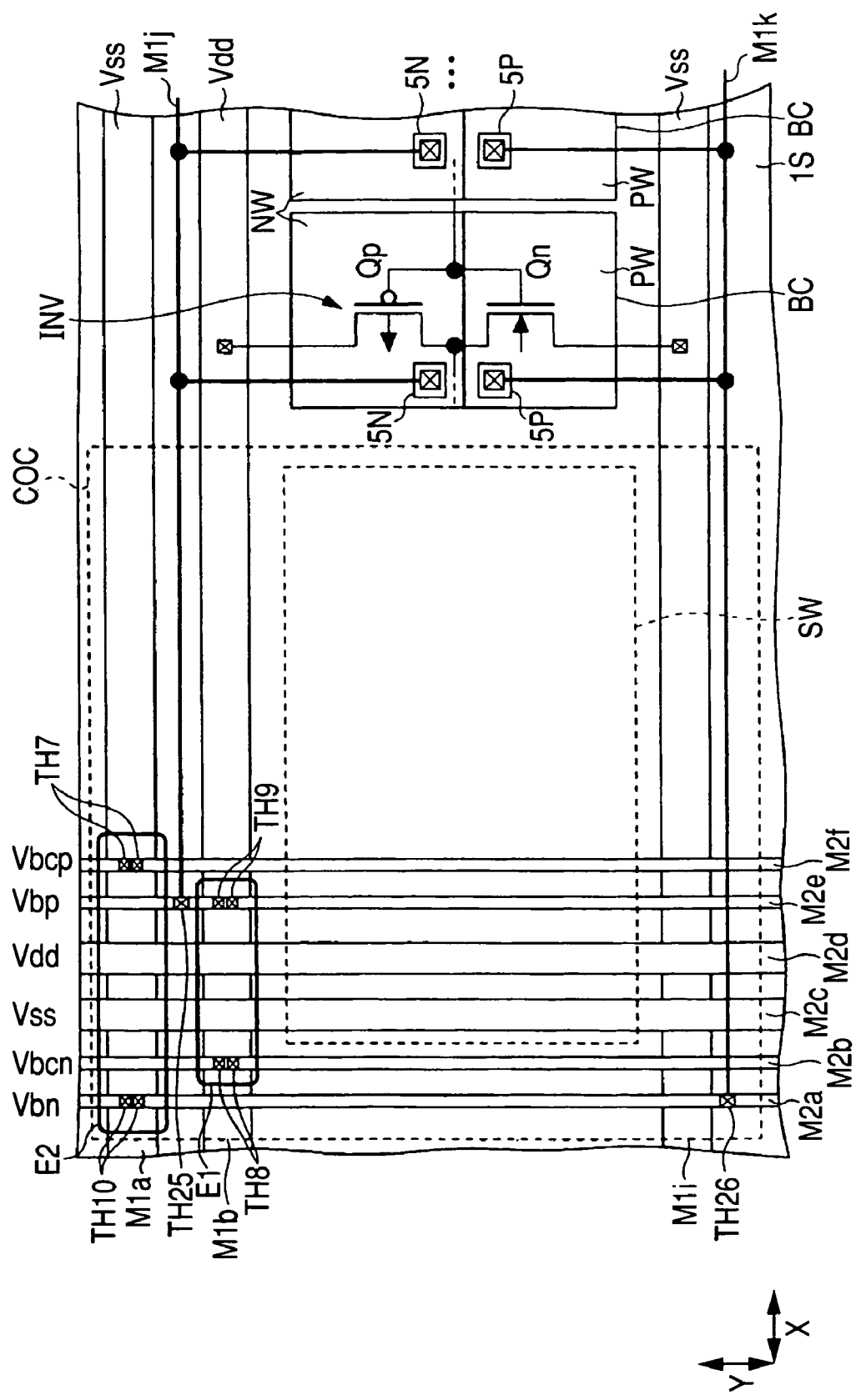
FIG. 20 is a fragmentary plan view illustrating the method of designing the semiconductor device, according to the still further embodiment of the present invention.

FIG. 19 typically shows a fragmentary plan view of a semiconductor device prior to invalidation of each substrate bias circuit. The switch circuit cell SW is first deleted to invalidate the substrate bias circuits. Subsequently, a connecting cell COC prepared in advance is taken out from a cell library and disposed in place of the switch circuit cell SW. FIG. 20 typically shows a fragmentary plan view of the semiconductor device after the connecting cell COC has been disposed. The connecting cell COC has information about through holes TH7 through TH10 which connect a wiring M2a for a substrate bias potential Vbn to a wiring M1a for a reference potential Vss, connect a wiring M2b for a control signal Vbcn to a wiring M1b for a power supply potential Vdd, connect a wiring M2e for a substrate bias potential Vbp to the wiring M1b, and connect a wiring M2f for a control signal Vbcp to the wiring M1a, respectively. Therefore, all substrate bias circuits lying in a semiconductor chip can be invalidated by only laying out the connecting cell COC at one spot of a substrate 1S. Of course, the connecting cell COC may be disposed at plural spots. When the present embodiment has circuits for invalidating the substrate bias circuits and circuits for non-invalidating the same, the connecting cell may be disposed at the switch circuit cell SW portion connected to a circuit group to be invalidated.

According to the embodiment 5, additional time required to design the semiconductor device is taken as compared with the embodiments 1 through 4. However, as compared with the case in which the semiconductor device is re-designed in its entirety, the time required to design the semiconductor device can be shortened and re-evaluation of each circuit can be eliminated, thereby making it possible to shorten the time required to design the semiconductor device. Since the switch circuit cell constituted of relatively large MISs to perform a stable operation can be eliminated, the load can be reduced. Therefore, it is possible to reduce the power consumption of the semiconductor device and improve its operating speed. Further, the area for the switch circuit cell can be used as an area for disposing each circuit cell BC by a portion corresponding to the elimination of the switch circuit cell, the number of circuit cells BC can be increased without incurring an increase in the area of a semiconductor chip. It is thus possible to promote an increase in the performance of the semiconductor device.

Embodiment 6

The embodiment 6 represents an example of a method of designing a semiconductor device having a configuration wherein power supply switches are inserted between circuit modules and a power supply potential to make it possible to cut off internal power supplies in the circuit modules, thereby making it possible to realize reductions in standby currents.

Figure 21:
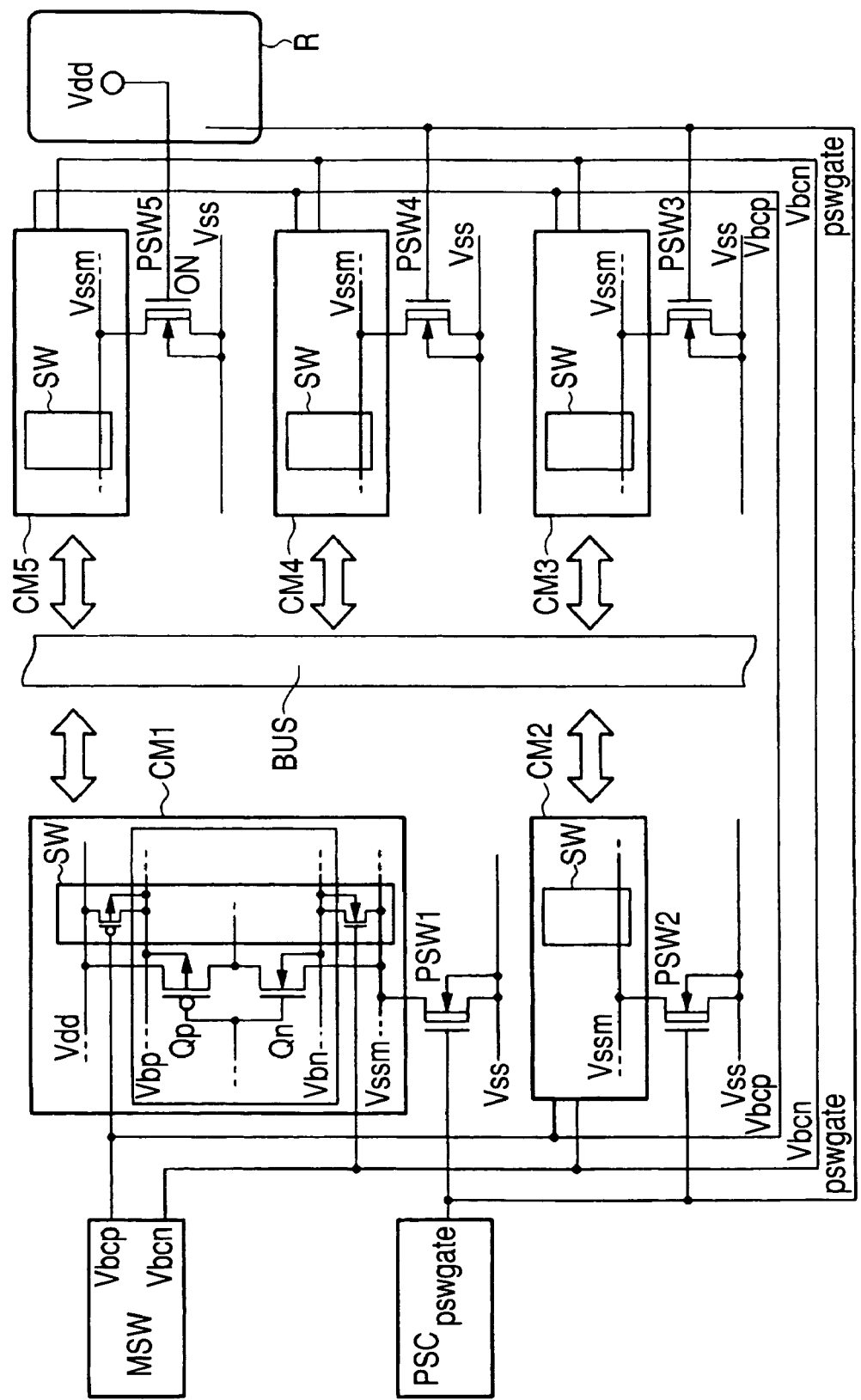
FIG. 21 is a diagram typically showing a circuit configuration of a semiconductor device illustrative of a still further embodiment of the present invention.

FIG. 21 typically shows one example of the semiconductor device according to the embodiment 6. A master switch MSW, a power supply switch controller PSC, a plurality of circuit modules CM1 through CM5, a plurality of power supply switches PSW1 through PSW5 connected between the circuit modules CM1 through CM5 and a reference potential Vss, and an address/data bus wiring BUS common to the respective circuit modules CM1 through CM5 are shown in FIG. 21.

The master switch MSW is a common switch for controlling on/off operations of switch circuit cells SW connected to the circuit modules CM1 through CM5. The operation of the master switch MSW enables control for switching potentials of wells for pMISs Qp and nMISs Qn in the respective circuit modules CM1 through CM5 to substrate bias potentials Vbp and Vbn and switching the potentials thereof to the power supply potential Vdd and the reference potential Vss. Even in the embodiment 6, those devices that require no substrate bias switching can be easily re-designed by the method described for each of the embodiments 1 through 5.

Also, the power supply switch controller PSC is a common switch for controlling on/off operations of the power supply switches PSW1 through PSW4. With the operation of the power supply switch controller PSC, the turning on/off of the power supply switches PSW1 through PSW4 is controlled, thereby making it possible to perform control for switching between the supply of the power supplies to the circuit modules CM1 through CM4 and shut-off of their supply. Inserting the power supply switches PSW1 through PSW4 between the circuit modules CM1 through CM4 and the reference potential Vss respectively makes it possible to shut off the internal power supplies in the circuit modules CM1 through CM4 and realize a reduction in the standby currents.

Meanwhile, there might be such a demand that with the change of a semiconductor device or the like, for example, it is desired to always keep active some circuit modules in a semiconductor chip in the case of the next-generation semiconductor device. Where all the circuits in the semiconductor device are re-designed here, much labor and time are required in the same manner as mentioned above. In such a case, the following may be considered, for example. For example, the circuit module CM5 is illustrative of a circuit module which does not undergo power shut-off and that one wants to keep active. In the embodiment 6, the power supply switch SW5 for supplying the power supply to the circuit module CM5 is separated from the power supply switch controller PSC. Then, a gate electrode of the power supply switch SW5 is fixed to the power supply potential Vdd, as indicated by an area R. Consequently, the circuit module CM5 can be always held in an active state. In the embodiment 6, as mentioned above, a change of design of the semiconductor device can be carried out by simply separating the power supply switch SW5 from the power supply switch controller PSC and connecting the gate electrode of the power supply switch PSW5 to the power supply potential Vdd. That is, the next-generation semiconductor device can easily be designed by using design data about the semiconductor device, having the power supply switches PSW1 through PSW5, as it is.

While the invention made above by the present inventors has been described specifically based on various illustrative embodiments, the present invention is not limited to these embodiments. It is needless to say that many changes can be made thereto within a scope not departing from the substance thereof.

For example, the wiring structure is not limited to a damascene wiring structure. The wiring structure may be configured as a normal wiring structure obtained by patterning a wiring material principally made up of, for example, aluminum.

While the above description has principally been directed to a case in which the invention made by the present inventors is applied to a semiconductor device having CMIS circuits, a semiconductor device having the SRAM modules, a semiconductor device having a SOC configuration, etc., which belong to the field of application corresponding to the background of the invention, the present invention is not limited to such examples. The present invention can be applied even to a semiconductor device having a memory circuit like, for example, a DRAM (Dynamic Random Access Memory) or a flash memory (EEPROM: Electric Erasable Programmable Read Only Memory) or the like.

An advantageous effect obtained by the invention disclosed in the present application will be explained in brief as follows:

Some of the wirings of a semiconductor device are changed in such a manner that a switch, which is provided for switching to determine whether substrate biases should be applied to circuit areas that need not use substrate bias circuits, is made invalid, and power supply voltages are applied to circuit areas that need not use the substrate bias circuits. Thus, since substrate biases can be fixed without spending time for re-design, it is possible to shorten the manufacturing time of a semiconductor device.

What is claimed is:

1. A method of manufacturing a semiconductor device, comprising steps of:
    (a) preparing design data of the semiconductor device having a plurality of circuit cells, a first wiring for supplying a first potential corresponding to a power supply potential to the plurality of circuit cells, a switch for performing switching between supply and non-supply of the first potential to each of semiconductor substrate areas of the plurality of circuit cells, a second wiring for supplying a signal for controlling operation of the switch, and a third wiring for supplying the first potential or a third potential higher than the first potential to each of the semiconductor substrate areas of the plurality of circuit cells; and
    (b) invalidating function of the switch and connecting the second wiring and the third wiring to the first wiring such that the potential supplied to each of the semiconductor substrate areas of the plurality of circuit cells is fixed to the power supply potential.

2. The method according to claim 1, wherein each of the semiconductor substrate areas of the plurality of circuit cells includes a semiconductor substrate area of first conductivity type, and a semiconductor substrate area of second conductivity type is opposite to the first conductivity type, the switch has a p channel type field effect transistor and an n channel type field effect transistor, the second wiring has one wiring for the p channel type field effect transistor and another wiring for the n channel type field effect transistor, and the third wiring includes wirings for the first conductivity type semiconductor substrate area and the second conductivity type semiconductor substrate area.

3. The method according to claim 1, wherein the second wiring and the third wiring, and the first wiring are connected within an internal circuit area.

4. The method according to claim 1, wherein the second wiring and the third wiring, and the first wiring are connected within a peripheral circuit area.

5. The method according to claim 1, wherein the plurality of circuit cells are formed with memory cells and logic gates or input/output circuits.

6. The method according to claim 1, further comprising a step of separating the second and third wirings from each other by a first circuit cell group that needs not supply the third potential, of the plurality of circuit cells, and a second circuit cell group that needs supply the third potential, of the plurality of circuit cells, wherein said (b) step is effected on the second and third wirings connected to the first circuit cell group.

7. A method of manufacturing a semiconductor device, comprising steps of:
(a) preparing design data of the semiconductor device having a plurality of circuit cells, a first wiring for supplying a first potential corresponding to a power supply potential to the plurality of circuit cells, a switch for performing switching between supply and non-supply of the first potential to each of semiconductor substrate areas of the plurality of circuit cells, a second wiring supplying a signal for controlling operation of the switch and having a portion intersecting the first wiring, and a third wiring supplying the first potential or a third potential higher than the first potential, and having a portion intersecting the first wiring and being connected to each of the semiconductor substrate areas of the plurality of circuit cells; and
(b) invalidating function of the switch, and connecting the second wiring to the first wiring at the point intersecting the first wiring and connecting the third wiring to the first wiring at a point intersecting the first wiring, such that the potential supplied to each of the semiconductor substrate areas of the plurality of circuit cells is fixed to the power supply potential.

8. The method according to claim 7, wherein the second wiring and the third wiring, and the first wiring are connected within an internal circuit area.

9. A method of manufacturing a semiconductor device, comprising steps of:
(a) preparing design data of the semiconductor device having an internal circuit area, a plurality of circuit cells disposed in the internal circuit area, a first wiring for supplying a first potential corresponding to a power supply potential to the plurality of circuit cells, a first switch for performing switching between supply and non-supply of the first potential to each of semiconductor substrate areas of the plurality of circuit cells, a plurality of input/output circuit cells disposed around the internal circuit area, a second switch disposed in each of the plural input/output circuit cells and for performing switching between supply and non-supply of the first potential to each of semiconductor substrate areas of the input/output circuit cells, a second wiring for supplying a signal for controlling operation of each of the first and second switches, and a third wiring supplying the first potential or a third potential higher than the first potential and connected to each of the semiconductor substrate areas of the plurality of circuit cells and the plurality of input/output circuit cells; and
(b) invalidating functions of the first and second switches, and connecting the second wiring and the third wiring to the first wiring such that the potential supplied to each of the semiconductor substrate areas of the plurality of circuit cells and the plurality of input/output circuit cells is fixed to the power supply potential.

10. The method according to claim 9, wherein the second wiring and the third wiring, and the first wiring are connected within a peripheral circuit area.

11. A method of manufacturing a semiconductor device, comprising steps of:
(a) preparing design data of the semiconductor device having a plurality of circuit cells, a first wiring for supplying a first potential corresponding to a power supply potential to the plurality of circuit cells, a switch for performing switching between supply and non-supply of the first potential to each of semiconductor substrate areas of the plurality of circuit cells, a second wiring for supplying a signal for controlling operation of the switch, and a third wiring for supplying the first potential or a third potential higher than the first potential to each of the semiconductor substrate areas of the plurality of circuit cells;
(b) separating the second and third wirings from each other by a first circuit cell group that needs not supply the third potential, of the plurality of circuit cells, and a second circuit cell group that needs supply the third potential, of the plurality of circuit cells; and
(c) invalidating function of the switch with respect to the first circuit cell group, and connecting the second wiring and the third wiring connected to the first circuit cell group to the first wiring such that the potential supplied to each of semiconductor substrate areas of the first circuit cell group is fixed to the power supply potential.

12. A method of manufacturing a semiconductor device, comprising steps of:
(a) preparing design data of the semiconductor device having a plurality of field effect transistors, a first wiring for supplying a first potential corresponding to a power supply potential to the plurality of field effect transistors, a switch for performing switching between supply and non-supply of the first potential to each of semiconductor substrate areas of the plurality of field effect transistors, a second wiring for supplying a signal for controlling operation of the switch, and a third wiring for supplying the first potential or a third potential higher than the first potential to each of the semiconductor substrate areas of the plurality of field effect transistors;
(b) separating the second and third wirings from each other by a first field effect transistor group that needs not supply the third potential, of the plurality of field effect transistors, and a second field effect transistor group that needs supply the third potential, of the plurality of field effect transistors; and
(c) invalidating function of the switch with respect to the first field effect transistor group, and connecting the second wiring and the third wiring connected to the first field effect transistor group to the first wiring such that the potential supplied to each of semiconductor substrate areas of the first field effect transistor group is fixed to the power supply potential.

13. The method according to claim 12, wherein the second field effect transistor group is lower in threshold value than the first field effect transistor group.

14. A method of manufacturing a semiconductor device, comprising steps of:
(a) preparing design data of the semiconductor device having a plurality of circuit cells, a first wiring for supplying a first potential corresponding to a power supply potential to the plurality of circuit cells, a switch for performing switching between supply and non-supply of the first potential to each of semiconductor substrate areas of the plurality of circuit cells, a second wiring for supplying a signal for controlling operation of the switch, and a third wiring for supplying the first potential or a third potential higher than the first potential to each of the semiconductor substrate areas of the plurality of circuit cells; and (b) invalidating function of the switch, and disposing, instead of the switch, a connecting cell having information for connecting the second wiring and the third wiring to the first wiring such that the potential supplied to each of the semiconductor substrate areas of the plurality of circuit cells is fixed to the power supply potential.

15. The method according to claim 14, wherein the connecting cell is disposed within an internal circuit area.

16. A method of manufacturing a semiconductor device, comprising steps of:

(a) preparing design data of the semiconductor device having a plurality of circuit portions, a plurality of power supply switches respectively connected to the plurality of circuit portions and for respectively performing switching between the supply and non-supply of a power supply potential to the plurality of circuit portions, and a power supply switch control means for controlling operations of the plurality of power supply switches;

(b) separating a power supply switch connected to one always operation-desired circuit portion of the plurality of circuit portions from the power supply switch control means; and (c) fixing the input of the power supply switch connected to the always operation-desired circuit portion to the power supply potential.

* * * * *